US012550682B2

(12) United States Patent
Maeda et al.

(10) Patent No.: US 12,550,682 B2
(45) Date of Patent: Feb. 10, 2026

(54) CONTROL DEVICE, CONTROL METHOD, AND PROGRAM

(71) Applicant: SCREEN Holdings Co., Ltd., Kyoto (JP)

(72) Inventors: Hidehiro Maeda, Yokohama (JP); Toshimasa Shimoda, Ageo (JP); Hajime Mitsuishi, Yokohama (JP); Hiroshi Mori, Tokyo (JP); Kishou Takahata, Tokyo (JP); Masahiro Yoshihashi, Abiko (JP); Takashi Shiomi, Yokohama (JP); Yoshihiro Maehara, Tokyo (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 581 days.

(21) Appl. No.: 17/929,854

(22) Filed: Sep. 6, 2022

(65) Prior Publication Data

US 2023/0052396 A1    Feb. 16, 2023

Related U.S. Application Data

(63) Continuation of application No. PCT/JP2021/008842, filed on Mar. 5, 2021.

(30) Foreign Application Priority Data

Mar. 6, 2020  (JP) .................... 2020-039015

(51) Int. Cl.
H01L 21/66 (2006.01)
(52) U.S. Cl.
CPC .................... H01L 22/26 (2013.01)

(58) Field of Classification Search
CPC ............... H01L 22/26; H01L 21/67248; H01L 21/67253; H01L 21/67259; H01L 21/681;
(Continued)

(56) References Cited

U.S. PATENT DOCUMENTS 11,257,699 B2 * 2/2022 Miyada ............. H01L 21/67265
2013/0105061 A1 * 5/2013 Castex .............. H01L 21/76251
156/60

(Continued)

FOREIGN PATENT DOCUMENTS

CN    101925978 A    12/2010
CN    103003933 A    3/2013
(Continued)

OTHER PUBLICATIONS

Request for the Submission of an Opinion issued by the Korean Intellectual property Office and mailed on Mar. 19, 2024 in counterpart Korean Patent Application No. 10-2022-7030888, with English translation thereof.

(Continued)

Primary Examiner — S M Sohel Imtiaz
(74) Attorney, Agent, or Firm — Rimon P.C.

(57) ABSTRACT

A control device configured to control a supply condition of a gas which is supplied between two substrates that are to be bonded to each other by a substrate bonding device, is configured to control the supply condition based on a measurement result obtained by a measurement in relation to at least one of the substrate, another substrate bonded before the substrate is bonded, or the substrate bonding device, and the two substrates are bonded to each other by a contact region expanding after the contact region is formed in a center.

18 Claims, 27 Drawing Sheets

(58) Field of Classification Search
CPC ... H01L 21/67092; H01L 22/12; H01L 21/02; H01L 21/67288; H01L 21/67017; H01L 21/67276
See application file for complete search history.

(56) References Cited

U.S. PATENT DOCUMENTS

| | | | | |
|---|---|---|---|---|
| 2013/0139946 | A1* | 6/2013 | Gaudin | H01L 21/67092 156/60 |
| 2020/0012254 | A1* | 1/2020 | Hirata | H01L 21/67745 |
| 2020/0219745 | A1* | 7/2020 | Okazaki | G05B 19/418 |
| 2021/0280429 | A1* | 9/2021 | Ookawa | H01L 21/67219 |
| 2021/0305029 | A1* | 9/2021 | Miyashita | H01J 37/32926 |
| 2022/0080551 | A1* | 3/2022 | Fukunaga | B24B 7/00 |
| 2022/0130689 | A1* | 4/2022 | Uno | H01L 21/304 |
| 2022/0157628 | A1* | 5/2022 | Okajima | H01L 21/67103 |
| 2022/0359212 | A1* | 11/2022 | Mori | H01L 21/67259 |

FOREIGN PATENT DOCUMENTS

| | | |
|---|---|---|
| EP | 2 091 071 A1 | 8/2009 |
| JP | 2013-531395 A | 8/2013 |
| JP | 2015-142117 A | 8/2015 |
| JP | 2019-71329 A | 5/2019 |
| JP | 2019129286 A * | 8/2019 |
| KR | 10-2010-0119780 A | 11/2010 |
| KR | 10-2021-0119780 A | 11/2010 |
| KR | 10-2013-0098271 A | 9/2013 |

OTHER PUBLICATIONS

Written Opinion of the International Searching Authority for International Application No. PCT/JP2021/008842, mailed May 18, 2021.
International Preliminary Report on Patentability, in corresponding international application No. PCT/JP2019/008842, issued Sep. 6, 2022.
International Search Report of International Application No. PCT/JP2021/008842 dated May 18, 2021.
Office Action issued by the Japanese Patent Office and mailed on Jun. 6, 2023 in counterpart Japanese Patent Application No. 2022-504487, with English translation thereof.

* cited by examiner

[EXPANSION OF CONTACT REGION AND RELATIVE SHAPES OF UPPER AND LOWER WAFERS]

CONTROL DEVICE, CONTROL METHOD, AND PROGRAM

BACKGROUND

1. Technical Field

The present invention relates to a control device, a control method, and a computer-readable medium. In particular, the present invention relates to a control device and a control method for controlling a supply condition of a gas, which is supplied between two substrates that are to be bonded to each other by a substrate bonding device, and a computer-readable medium having recorded thereon a program that causes the control method to be executed.

2. Related Art

A technology (for example, Patent Document 1), in which a point of initiation of a bonding wave is applied between two wafers that are to be bonded to each other in a state of one wafer being arranged on the other wafer in the two wafers, and a plurality of nozzles are oriented toward the point of initiation for a gas flow to be projected by detecting, as a trigger, a position of the point of initiation by a position sensor, has been known.

Patent Document 1: Japanese Translation of PCT International Publication No. 2013-531395

However, it was not possible for the technology described above to efficiently reduce a void generated in an outer peripheral portion between the two wafers.

DESCRIPTION OF EXEMPLARY EMBODIMENTS

The embodiments do not limit the invention according to the claims, and all the combinations of the features described in the embodiments are not necessarily essential to means provided by aspects of the invention.

Figure 1:
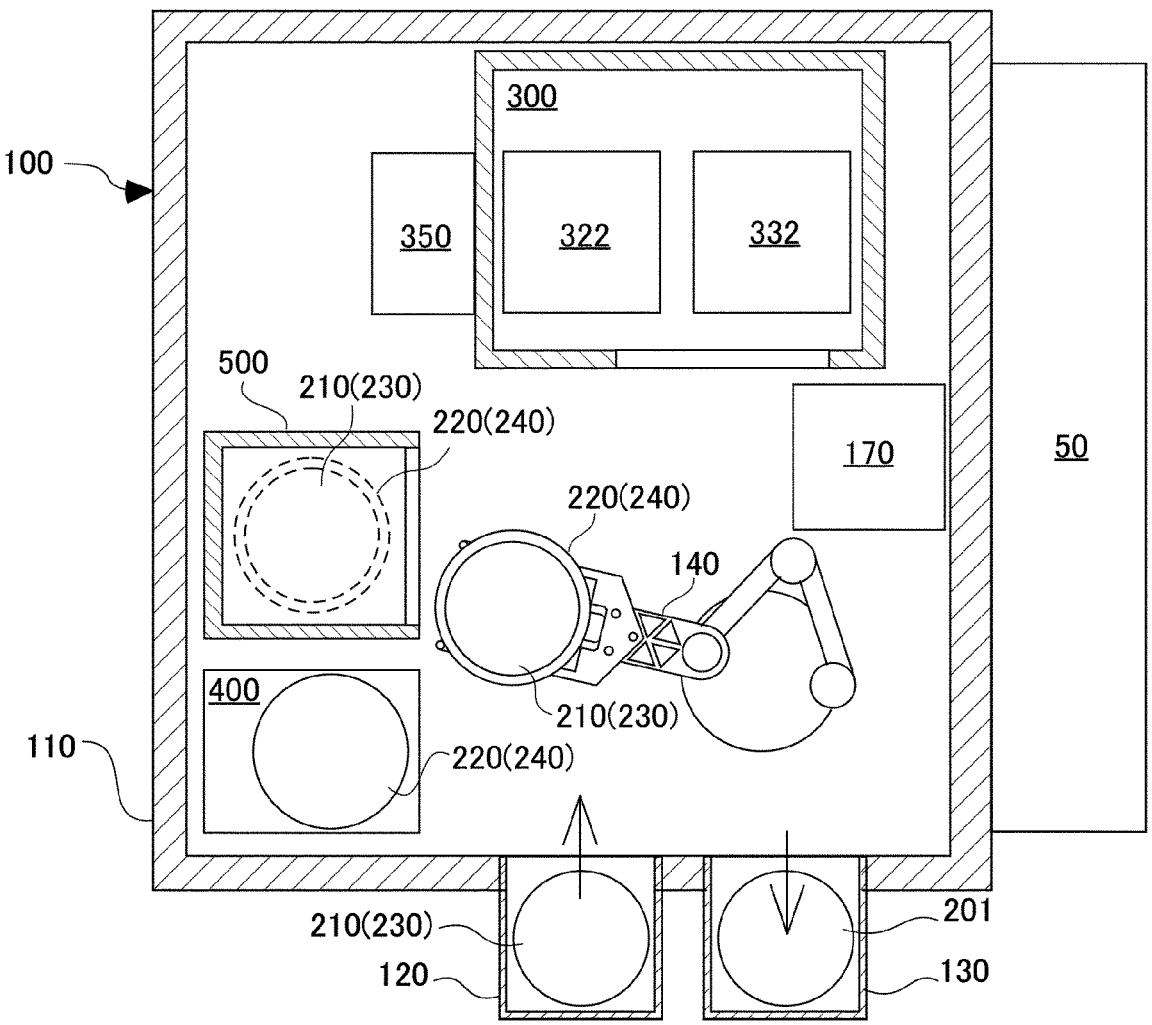
FIG. 1 is a schematic plan view of a substrate bonding unit 10.

FIG. 1 is a schematic plan view of a substrate bonding unit 10. The substrate bonding unit 10 includes a control device 50 and a substrate bonding device 100.

The control device 50 controls the substrate bonding device 100 that bonds at least two substrates 210, 230 to each other to manufacture a layered substrate 201. More specifically, the control device 50 according to the present embodiment performs an overall control of each portion of the substrate bonding device 100 in conjunction with each other. In addition, the control device 50 may receive, for example, an instruction of a user from an outside, and set a manufacturing condition when the layered substrate 201 is manufactured. The control device 50 may further have a user interface that displays an operating state of the substrate bonding device 100 to the user on the outside.

The substrate bonding device 100 includes a housing 110, substrate cassettes 120, 130, a holder stocker 400, a transportation portion 140, an activation device 170, a bonding portion 300, a gas supply portion 350, and a pre-aligner 500.

The housing 110 houses the substrate cassettes 120, 130, the transportation portion 140, the bonding portion 300, the holder stocker 400, and the pre-aligner 500. A temperature inside the housing 110 is controlled and for example, is kept at a room temperature.

The substrate cassette 120 houses the substrates 210, 230 that are to be bonded to each other. The substrate cassette 130 houses the layered substrate 201.

Each of the substrates 210, 230 has a plurality of structures formed on a surface of a silicon wafer. An example of the plurality of structures is in a plurality of circuit regions that are periodically arranged in a plane direction on respective surfaces of the substrates 210, 230, and each of the plurality of circuit regions is provided with wiring and a protective film formed by a photolithography technology or the like, or a connection structure such as a pad and a bump that serves as a connection terminal when the substrates 210, 230 are electrically connected to the other substrates 230, 210, a lead frame, or the like. Other examples of the plurality of structures are a plurality of alignment marks that serve as indices when the substrates 210, 230 are aligned with the other substrates 230, 210. The plurality of alignment marks are provided, for example, at scribe lines arranged between the plurality of circuit regions on the respective surfaces of the substrates 210, 230.

The holder stocker 400 houses substrate holders 220, 240 that hold the substrates 210, 230. The substrate holders 220, 240 are formed of a hard material such as alumina ceramics, and attract and hold the substrates 210, 230, the layered substrate 201, or the like by an electrostatic chuck, a vacuum chuck, or the like. In the substrate holders 220, 240, overall shapes of support surfaces may be flat, may be centrally protruding shapes, or may have, for example, free-form surfaces with shapes to correspond to in-plane deformations of the substrates to be held.

The transportation portion 140 individually holds and transports each of the substrates 210, 230, the substrate holders 220, 240, the layered substrate 201, or the like, or holds and transports the substrate holders 220, 240, or the like which hold the substrates 210, 230, the layered substrate 201, or the like.

The substrate holders 220, 240 that hold the substrates 210, 230 are loaded into the activation device 170 by the transportation portion 140 described above. The activation device 170 generates plasma that cleans each of bonding surfaces of the substrates 210, 230. In the activation device 170, for example, by an oxygen gas, which is a processing gas, being excited under a reduced-pressure atmosphere to be the plasma, and an oxygen ion being radiated to the bonding surface of each of the substrates 210, 230, for example, when the substrate 230 is a wafer having an SiO film formed on Si, an SiO bond on the bonding surface is cut to form a dangling bond of Si and O. A formation of such a dangling bond on the surface of the substrate may be referred to as activation. When an exposure to the atmosphere is performed in this state, moisture in air bonds to the dangling bond, and a substrate surface is covered with an OH group. Thereby, the surface of the substrate is brought into a state of easily bonding to a water molecule, that is, a state of being easily hydrophilized. That is, the activation causes a state in which the surface of the substrate is easily hydrophilic as a result. A hydrophilization device (not shown), which hydrophilizes the surface of the substrate, applies, for example, pure water to the respective bonding surfaces of the two substrates to hydrophilize the bonding surfaces, and cleans the bonding surfaces.

It should be noted that the activation device 170 may activate the surfaces of the substrates 210, 230 by sputter etching using an inert gas, an ion beam, a fast atom beam, or the like, in addition to a method of an exposure to the plasma. When the ion beam or the fast atom beam is used, a generation is possible by the activation device 170 being set under a reduced pressure. Furthermore, the activation device 170 may activate the substrates 210, 230 by an ultraviolet irradiation, an ozone asher, or the like. Furthermore, the activation device 170 may perform the activation by chemically cleaning the surfaces of the substrates 210, 230 by using, for example, a liquid or gaseous etchant. It should be noted that in the substrates 210, 230, the surfaces may be hydrophilized by the hydrophilization device described above after the surfaces are activated.

The bonding portion 300 has an upper stage 322 and a lower stage 332 that face each other. The upper stage 322 holds the activated substrates 210, 230 via the substrate holders 220, 240. The lower stage 332 similarly holds the activated substrates 210, 230 via the substrate holders 220, 240.

The upper stage 322 and the lower stage 332 may directly hold the activated substrates 210, 230, respectively. In this case, the substrate holders may be fixed to the upper stage 322 and the lower stage 332. In other words, a case of a reference to the substrate holder may refer to a case of a transportable device such as the substrate holders 220, 240, or may refer to a case of a non-transportable device that is provided to be fixed to the upper stage 322 and the lower stage 332. It should be noted that the upper stage 322 and the lower stage 332 are examples of two holding portions holding the substrates 210, 230 that are to be bonded to each other.

The bonding portion 300 aligns the substrates 210, 230 held by the upper stage 322 and the lower stage 332 with each other. After that, by maintaining a state in which one of the substrates 210, 230 is held by one of the upper stage 322 and the lower stage 332, and releasing the other of the substrates 210, 230 held by the other of the upper stage 322 and the lower stage 332, the bonding portion 300 brings the substrates 210, 230, whose surfaces are activated, into contact with each other, to be bonded to each other.

Here, the state of being bonded to each other may refer to a state in which terminals provided on two layered substrates are connected to each other, thereby ensuring electrical conduction between the two substrates. In addition, the state of being bonded to each other may refer to a state in which the terminals provided on the two layered substrates are connected to each other, whereby a bonding strength of the two substrates is greater than or equal to a predetermined strength. In addition, when the terminals of the two substrates are electrically connected by performing treatment such as annealing on the two layered substrates, the state of being bonded to each other may refer to a state in which the two substrates are temporarily bonded to each other before the treatment such as the annealing, that is, a state of being tentatively bonded to each other. In addition, when the terminals for electrical connection are formed on the two substrates after the two substrates are bonded to each other, the state of being bonded to each other may refer to a state in which bonding surfaces of the two substrates, on which the terminals are not formed, are bonded to each other. In addition, when the bonding strength of the two substrates is greater than or equal to a predetermined strength by performing the treatment such as annealing on the two layered substrates, the state of being bonded to each other may refer to the above-described state of being tentatively bonded to each other before the treatment such as annealing. The state, in which the bonding strength is greater than or equal to a predetermined strength by the annealing, includes, for example, a state in which the surfaces of the two substrates are bonded to each other by a covalent bond. In addition, the state of being tentatively bonded to each other includes a state in which two stacked substrates can be separated to be reused.

The gas supply portion 350 is connected to the bonding portion 300 and supplies a gas into the bonding portion 300. More specifically, the gas supply portion 350 is configured to supply the gas to a space between the substrates 210, 230 that are to be bonded to each other, before the contact between the substrates 210, 230. The gas supply portion 350 supplies the gas to the space between the substrates 210, 230 even after the contact between the substrates 210, 230. The gas supply portion 350 according to the present embodiment may replace, with the gas, an atmosphere existing between the substrates 210, 230 before the contact between the substrates 210, 230, and continue to supply the gas to the space between the substrates 210, 230 until a contact region reaches outer peripheral sides of the substrates 210, 230 after the contact between the substrates 210, 230. An example of the gas may be a gas obtained by controlling a humidity of an inert gas such as a helium (He) gas, an argon (Ar) gas, and a mixed gas of helium and argon, a nitrogen ($N_2$) gas, CDA (clean dry air), or the like. In the present embodiment, the gas is helium that has a lower specific gravity than that of the air. It should be noted that the contact region described above is a region that is formed between the substrates 210, 230 and that gradually expands by bringing a part of the substrate 210 and a part of the substrate 230 into contact with each other.

The gas supply portion 350 is able to adjust a supply condition of the gas based on a command from the control device 50. The gas supply portion 350 has, as an example, a heater, a mass flow control device, a regulator, or the like, and is able to adjust a temperature, a flow rate, a pressure, or the like of the gas.

It should be noted that in the bonding portion 300 in the present embodiment, in addition to the gas which is supplied by the gas supply portion 350, the air flows in one direction from sides of the substrates 210, 230 toward the substrates 210, 230 to keep constant the temperature between the substrates 210, 230 that are to be bonded to each other. The air flow in one direction may be referred to as a side flow. A humidity of the air may be kept constant.

The pre-aligner 500 respectively aligns the substrates 210, 230 with the substrate holders 220, 240, and respectively causes the substrates 210, 230 to be held by the substrate holders 220, 240.

In the substrate bonding device 100 as described above, it is possible to bond, in addition to the substrates 210, 230 on which an element, a circuit, a terminal, or the like is formed as described above, a bare silicon wafer that is an unprocessed silicon wafer on which no structure is formed, a SiGe substrate obtained by adding Ge, a Ge single crystal substrate, a compound semiconductor wafer of groups III-V or groups II-VI, a glass substrate, and the like. A target that is bonded to each other may include a circuit substrate and an unprocessed substrate, or unprocessed substrates. The substrates 210, 230, which are to be bonded to each other, themselves may be the layered substrate 201 having a plurality of substrates that are already layered. The substrates 210, 230 that are to be bonded to each other may have, for example, approximately the same external dimension as each other in a state in which a deformation does not occur. It should be noted that outer shapes of the substrates 210, 230 may be substantially circular, or may be other shapes.

FIG. 2A to FIG. 4 are schematic cross sectional views of the bonding portion 300 for describing an operation of the bonding portion 300 before a gas control step. With reference to FIG. 2A to FIG. 4, a configuration of the bonding portion 300 of the present embodiment, and a summary of a step before the gas control step including, for example, an alignment step between the substrate 210 and the substrate 230, or the like, in the bonding portion 300, will be described.

Figure 2A:
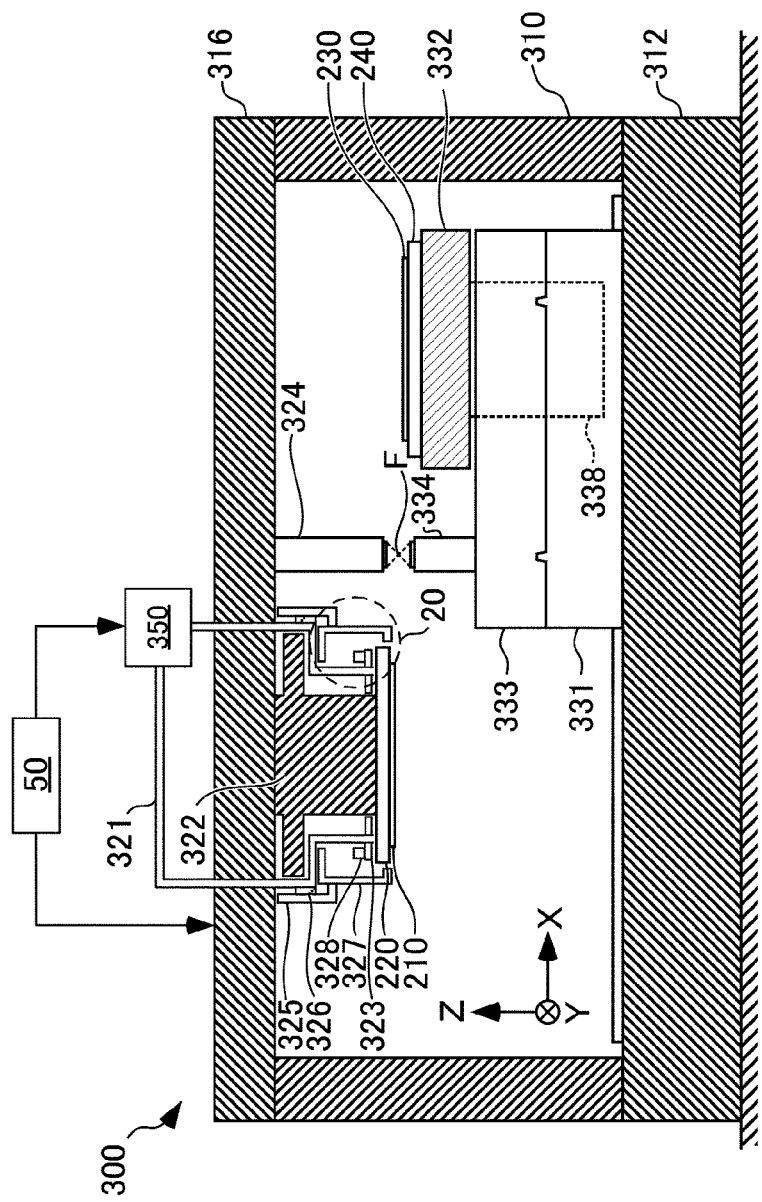
FIG. 2A is a schematic cross sectional view of a bonding portion 300 for describing an operation of the bonding portion 300 before a gas control step.

As shown in FIG. 2A, in the present embodiment, the control device 50 causes the upper stage 322 of the bonding portion 300 to hold the substrate 210 via the substrate holder 220, and causes the lower stage 332 to hold the substrate 230 via the substrate holder 240. The substrate holder 220 holding the substrate 210 is loaded into the bonding portion 300 by the transportation portion 140, and is placed on the upper stage 322, and the substrate holder 240 holding the substrate 230 is loaded into the bonding portion 300, and is placed on the lower stage 332.

The upper stage 322 has a holding function of the vacuum chuck, the electrostatic chuck, or the like, and is fixed to a top plate 316 of a frame body 310 in a downward manner. The lower stage 332 has a holding function of the vacuum chuck, the electrostatic chuck, or the like, and is mounted on an upper surface of a Y direction drive portion 333 overlapping an X direction drive portion 331 arranged on a bottom plate 312 of the frame body 310. It should be noted that in FIG. 2A to FIG. 4, configurations of the support surfaces of the substrate holders 220, 240 are simplified to be drawn to be flat. The following drawings are similar, and the duplicate description will be omitted.

On the top plate 316, a microscope 324 is fixed to a side of the upper stage 322. The microscope 324 can observe an upper surface of the substrate 230 held by the lower stage 332. On the top plate 316, a plurality of fixed pipe portions 321 are further fixed to the side of the upper stage 322.

Each of the plurality of fixed pipe portions 321 has one end connected to the gas supply portion 350, has the other end exposed to the side of the upper stage 322 in the bonding portion 300, and is able to send, into the bonding portion 300, the gas which is supplied from the gas supply portion 350. Each of the plurality of fixed pipe portions 321 in the present embodiment is provided with a valve for a flow rate adjustment at the one end, and the flow rate of the gas, which is supplied into the bonding portion 300, is individually or collectively adjusted by the gas supply portion 350.

As an example, as shown in FIG. 2A, a top plate for filling 323 that surrounds the upper stage 322 of the substrate holder 220 is coupled to the other end of the fixed pipe portion 321. As another example, a cover portion for filling 327 that surrounds the upper stage 322 of the substrate holder 220 may be coupled to the other end of the fixed pipe portion 321. In the present embodiment, some of the plurality of fixed pipe portions 321 have the top plate for filling 323 coupled to the other end, and some of the plurality of fixed pipe portions 321 have the cover portion for filling 327 coupled to the other end. It should be noted that in FIG. 2A, an illustration of a portion of the fixed pipe portion 321 is omitted simply for the purpose of clarifying the description.

The top plate for filling 323 is a member that has a disk shape and that has an opening, through which the upper stage 322 passes, formed in the center. The top plate for filling 323 is arranged to face a back surface of the substrate holder 220, that is, a surface on which the substrate 210 is not placed when the substrate holder 220 is held by the upper stage 322. The top plate for filling 323 is coupled to the fixed pipe portion 321 such that the other end of the fixed pipe portion 321 is exposed between the top plate for filling 323 and the substrate holder 220 when the substrate holder 220 is held by the upper stage 322. A sealing member 328 that is flat and annular is fixed to an upper surface of the top plate for filling 323 along an outer periphery of the top plate for filling 323. The sealing member 328 may be made of rubber, for example. It should be noted that the sealing member 328 may be an O-ring.

Figure 2B:
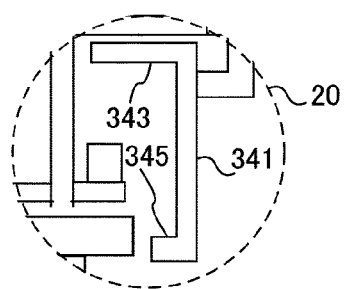
FIG. 2B is a partially enlarged view inside a circle of a dashed line 20 in FIG. 2A.

The cover portion for filling 327 is a member that has a rectangular and tubular shape as a whole and that has an opening, through which the upper stage 322 or the like passes, formed in the center. As shown in FIG. 2B, which is a partially enlarged view of a circle of a dashed line 20 in FIG. 2A, the cover portion for filling 327 includes a side wall 341; a top plate 343 that extends toward the center side in an XY plane from an upper end of the side wall 341 on a positive side in a Z axis direction; and a bottom plate 345 that extends toward the center side in the XY plane from a lower end of the side wall 341 on a negative side in the Z axis direction.

The cover portion for filling 327 is held by the fixed pipe portion 321 via an air cylinder portion 326 and a raising and lowering arm portion 325. The air cylinder portion 326 is coupled to the fixed pipe portion 321, and expands and contracts in the Z axis direction by energy of compressed air. The raising and lowering arm portion 325 is coupled to the air cylinder portion 326, and is able to be raised and lowered in the Z axis direction by an expansion and a contraction of the air cylinder portion 326. Therefore, the cover portion for filling 327 is able to be raised and lowered in the Z axis direction as the raising and lowering arm portion 325 is raised and lowered.

When the cover portion for filling 327 is raised to a most positive side in the Z axis direction, a lower end of the cover portion for filling 327 in the Z axis direction is positioned on the positive side in the Z axis direction further than the bonding surface of the substrate 210 held by the upper stage 322. Therefore, in a case of being raised to the most positive side in the Z axis direction, the cover portion for filling 327 does not come into contact with a component such as the substrate 230 on lower stage 332 that moves in the XY plane on the negative side in the Z axis direction further than the bonding surface of the substrate 210 held by the upper stage 322. It should be noted that as shown in FIG. 2A to FIG. 4, the raising and lowering arm portion 325 and the cover portion for filling 327 before the gas control step keep states of being positioned on the most positive side in the Z axis direction.

In addition, in a case of being lowered down to a most negative side in the Z axis direction in a state in which the substrate 210 and the substrate 230 held by the upper stage 322 and the lower stage 332 face each other, the cover portion for filling 327 can surround the substrate 210 and the substrate 230 from the sides over entire peripheries of the substrate 210 and substrate the 230. In the case of being lowered down to the most negative side in the Z axis direction, the bottom plate 345 of the cover portion for filling 327 is at approximately the same position as that of the substrate holder 240 in the Z axis direction, and the top plate 343 of the cover portion for filling 327 is connected to the top plate for filling 323 via the sealing member 328. It should be noted that in such a case, the sealing member 328 may be in close contact with a lower surface of the top plate 343 of the cover portion for filling 327 over the entire periphery.

The X direction drive portion 331 moves in a direction indicated by an arrow X in the drawing, parallel to the bottom plate 312. The Y direction drive portion 333 moves in a direction indicated by an arrow Y in the drawing, parallel to the bottom plate 312 on the X direction drive portion 331. By combining operations of the X direction drive portion 331 and the Y direction drive portion 333, the lower stage 332 moves parallel to the bottom plate 312 in a two dimensional manner.

In addition, the lower stage 332 is supported by a raising and lowering drive portion 338, and is driven, by a drive of the raising and lowering drive portion 338, to be raised and lowered in a direction indicated by an arrow Z in the drawing. In this way, between the lower stage 332 and the upper stage 322, which holds the substrate 210 via the substrate holder 220, the lower stage 332 changes relative positions of the substrate 230 held by the substrate holder 240, and the substrate 210 held by the substrate holder 220.

An amount of movement of the lower stage 332 by the X direction drive portion 331, the Y direction drive portion 333, and the raising and lowering drive portion 338 is precisely measured by using an interferometer or the like.

A microscope 334 is mounted, on the Y direction drive portion 333, on a side of the lower stage 332. The microscope 334 can observe a surface which is a lower surface of the substrate 210 held on the upper stage 322.

It should be noted that the bonding portion 300 may further include a rotation drive portion that rotates the lower stage 332 around a rotation axis perpendicular to the bottom plate 312, and a swing drive portion that swings the lower stage 332. This makes it possible for the lower stage 332 to be parallel to the upper stage 322, and for the substrate 230 held by the lower stage 332 to be rotated, thereby enhancing an alignment precision of the substrates 210, 230.

The microscopes 324, 334 are calibrated by the control device 50 aligning focal points with each other, and observing a common index. Thereby, relative positions of a pair of the microscopes 324, 334 in the bonding portion 300 are measured.

Figure 3:
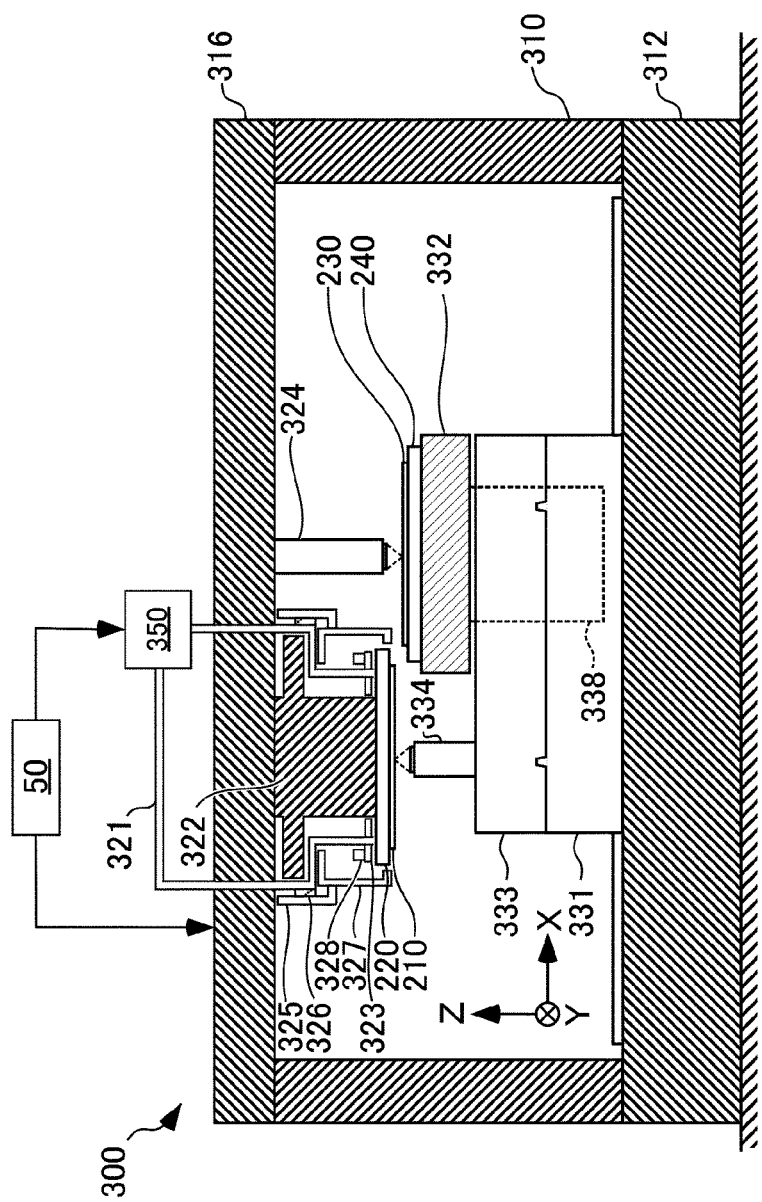
FIG. 3 is a schematic cross sectional view of the bonding portion 300 for describing an operation of the bonding portion 300 before the gas control step.

Following the state shown in FIG. 2A, as shown in FIG. 3, the control device 50 operates the X direction drive portion 331 and the Y direction drive portion 333, causes the alignment marks, which are respectively provided on the substrate 210 and the substrate 230, to be detected by the microscopes 324, 334 whose relative positions are known, and calculates the relative positions of substrate 210 and the substrate 230. Then, amounts of relative movements of the substrate 210 and the substrate 230 are calculated such that an amount of misalignment of the corresponding alignment marks on the substrate 210 and the substrate 230 is smaller than or equal to a predetermined threshold value and such that an amount of misalignment of corresponding connection structures between the substrate 210 and the substrate 230 is smaller than or equal to a predetermined threshold value. The misalignment may refer to the misalignment of corresponding alignment marks between the substrate 210 and the substrate 230 that are bonded to each other, or may refer to the misalignment of the corresponding connection structures between the substrate 210 and the substrate 230 that are bonded to each other. The misalignment may be due to a difference in an amount of deformation occurring in each of the two substrates 210,230.

Here, the threshold value may be an amount of misalignment that enables the electrical conduction between the substrates 210, 230 when the bonding of the substrates 210, 230 to each other is completed, or may be an amount of misalignment when the structures provided on the respective substrates 210, 230 are in contact with each other at least partially. When the amount of misalignment between the substrates 210, 230 is larger than or equal to a predetermined threshold value, the control device 50 may determine a state in which the connection structures are not in contact with each other, or the appropriate electrical conduction cannot be obtained, or a state in which a predetermined bonding strength cannot be obtained between the connection structures.

Figure 4:
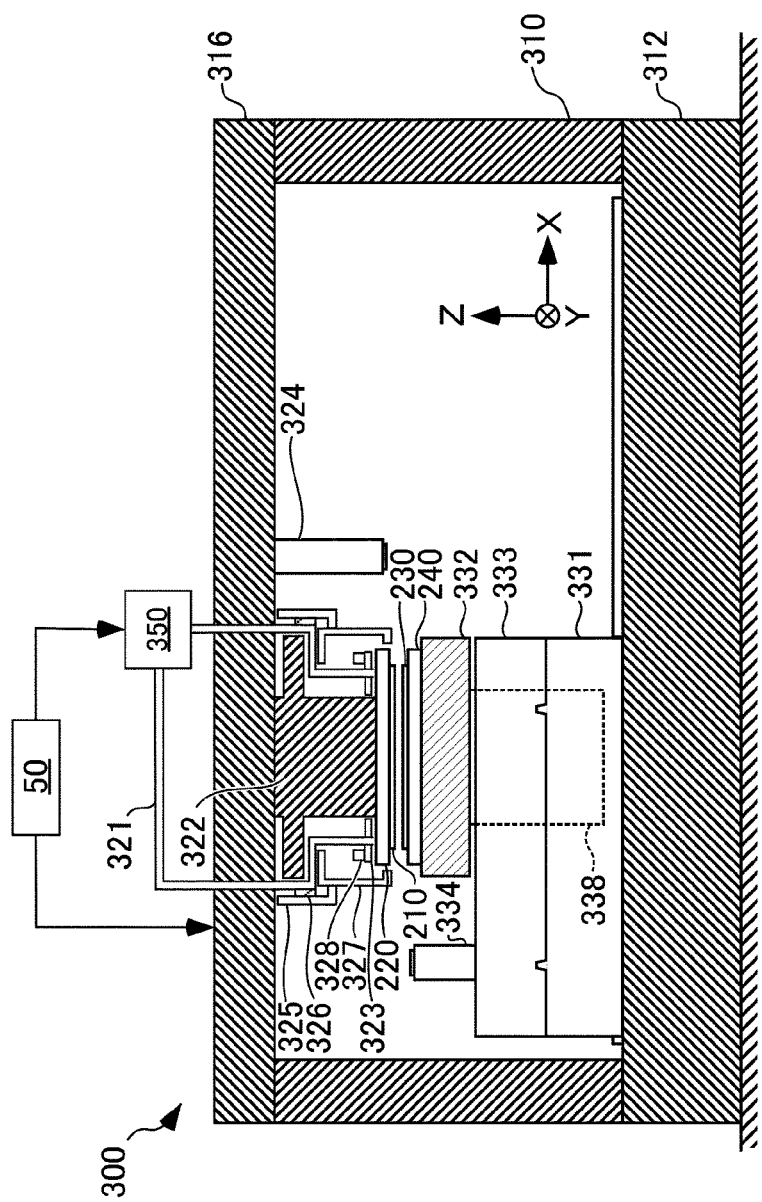
FIG. 4 is a schematic cross sectional view of the bonding portion 300 for describing an operation of the bonding portion 300 before the gas control step.

Following the state shown in FIG. 3, as shown in FIG. 4, the control device 50 moves the lower stage 332 to align the substrate 210 and the substrate 230 with each other. More specifically, the control device 50 moves the lower stage 332 based on the relative positions of the microscopes 324, 334 and the positions of the alignment marks of the substrates 210, 230 such that the positions of the alignment marks match each other.

Figure 5A:
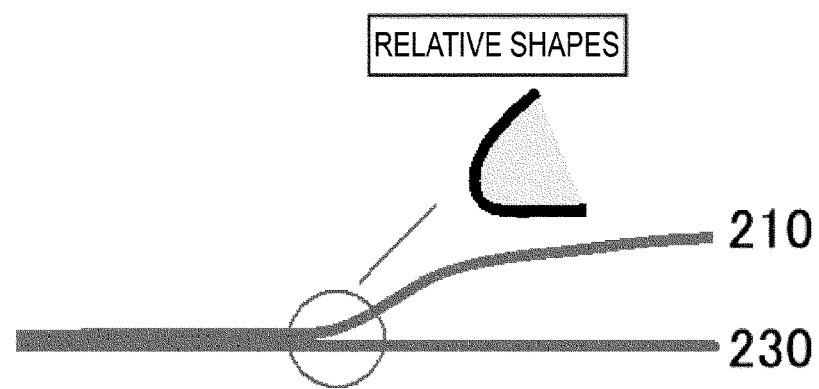
FIG. 5A is an illustration of an expansion of a contact region and relative shapes of upper and lower wafers.
Figure 5B:
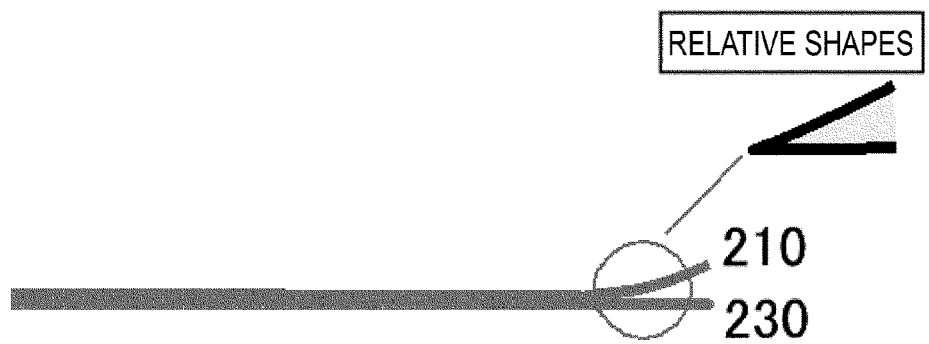
FIG. 5B is an illustration of the expansion of the contact region and the relative shapes of the upper and lower wafers.

FIG. 5A and FIG. 5B are illustrations of an expansion of a contact region and relative shapes of the substrates 210, 230. As described above, when the substrate 230 and the substrate 210 are bonded to each other, a part of the substrate 230 and a part of the substrate 210 are brought into contact with each other to form the contact region, and then the contact region expands.

For example, when the substrate holder 240 has the support surface of the centrally protruding shape, a projected portion of the substrate 230 deformed into the protruding shape, by following a curved support surface of the substrate holder 240, is brought into contact with the substrate 210 to form the contact region, and then, in a state in which the substrate 230 is deformed, the substrate 210 and the substrate 230 are bonded to each other by widening the contact region.

More specifically, first, the substrate 210 and the substrate 230 are caused to be close to each other such that a part of the substrate 210, and a part of the substrate 230 are brought into contact with each other to form the contact region at an already activated contact location. Further, by releasing the holding of the substrate 210 by the upper stage 322 via the substrate holder 220, regions adjacent to the contact location are autonomously attracted to each other by intermolecular force between the mutual activated surfaces, a bonding wave (Bonding Wave, which is also referred to as the bonding wave, hereinafter may be referred to as a BW), in which the contact region sequentially expands outwards in radial directions of the substrate 210 and the substrate 230, is generated, whereby the substrate 210 and the substrate 230 are bonded to each other in a state in which the substrate 230 is deformed.

By using the substrate holder 240 having the support surface of the centrally protruding shape, only one contact location is formed on the substrate 210 and the substrate 230, and as a result, it is possible to suppress generations of voids in the bonding surface due to separate formations of a plurality of contact locations. It should be noted that in the present embodiment, a bonding process includes a process from when the substrate 210 and the substrate 230 are partially in contact with each other to when the expansion of the contact region ends.

FIG. 5A shows a state in which an outer peripheral portion of the contact region (that is, a tip portion in a direction in which the BW progresses in a cross section) is still positioned on center sides of the substrates 210, 230, and FIG. 5B shows a state in which the outer peripheral portion of the contact region reaches the outer peripheral sides of the substrates 210, 230. It should be noted that the upper and lower substrate holders are omitted in FIG. 5A and FIG. 5B.

In the state of FIG. 5A, the substrate 210 of an upper part, which is not held by the substrate holder and is free, is in a state of being greatly bent due to a resistance of air existing between the substrates. On the other hand, in the state of FIG. 5B, the outer peripheral portion of the contact region reaches the outer peripheral sides of the substrates 210, 230, and thus the air existing between the substrates is discharged to the outside to cause a change of a way how the substrate 210 receives the air resistance. That is, an area, which receives the resistance of the air existing between the substrates, on the outer peripheral sides of the substrates 210, 230 is smaller than the area on the center side of the substrates 210, 230, and a space between the substrates is about to be closed while the substrate 210 has a flat shape (a linear shape when viewed in a cross section).

FIG. 5A and FIG. 5B schematically illustrate, on upper parts, the relative shapes of the substrates 210, 230 at the outer peripheral portion of the contact region in each state. When the two relative shapes are compared, an interval between the substrates 210, 230 at a position of any certain distance from the contact region toward the outer peripheral side is narrower in a state in which the contact region is positioned on the outer peripheral side than in a state in which the contact region is positioned on the center side. When the interval between the substrates 210, 230 is narrow, the pressure of the gas such as the air existing between the substrates 210, 230, or a liquid such as water generated by dew condensation easily increases. As a result, the gas or the liquid remains between the substrates 210, 230 without being pushed out toward the outside, thereby making a void (also referred to as an air bubble) that can cause peeling of the layered substrate 201. In other words, a risk of generating the void is higher in the outer peripheral portion between the substrates 210, 230 that are to be bonded to each other than in a central portion. It should be noted that in a case where the substrates 210, 230 with a diameter of 300 mm are bonded by using a substrate holder having a holding region (a region in contact with the substrate 230 that maintains the holding during the bonding process) with a diameter slightly smaller than the diameter of the substrates 210, 230, that is, in a case where an overhang portion, which is not held by the substrate holder at a peripheral edge of the substrate 230, exists, experimental data that a plurality of voids are generated several millimeters inwards from a peripheral edge of the layered substrate 201 is obtained. It should be noted that even in a case where no overhang portion, which is not held by the substrate holder at the peripheral edge of the substrate 230, exists, the void may be generated several millimeters inwards from the peripheral edge of the layered substrate 201.

A type of the void that is generated in the outer peripheral portion of the layered substrate 201 includes, for example, a stepped void and an adiabatic expansion void. The stepped void is a void that is generated due to the gas such as the air remaining, by the outer peripheral sides of the bonding surfaces of the substrates 210, 230 not being flat, in a portion which is not flat during the bonding process. The adiabatic expansion void is a void that is generated due to the moisture being condensed by the gas, which contains the moisture that has moved from the center sides of the substrates 210, 230 toward the outer peripheral sides during the bonding process, being subjected to an adiabatic expansion by a large pressure change with respect to the outsides of the substrates 210, 230, and the temperature of the gas rapidly dropping. Accordingly, the adiabatic expansion void is a void in which the risk of generating the void is high as a speed of the BW is high or as the air pressure between the upper and lower substrates is high.

FIG. 6A to FIG. 6D are schematic illustrations for describing examples of a relationship between an outer peripheral droop and a warp of the substrate 230, and an interval between the substrates 210, 230 on an outer peripheral side. In the examples shown in FIG. 6A to FIG. 6D, the substrate holder 240 has a wall portion 241 that is annular and surrounds at least an outer peripheral side of the support surface over the entire periphery, and attracts the substrate 230 placed on the wall portion 241 by applying a negative pressure to an inside of the wall portion 241. In addition, in the examples shown in FIG. 6A to FIG. 6D, at the peripheral edge of the substrate 230, an overhang portion, which is positioned on the outer peripheral side further than the wall portion 241 of the substrate holder 240, and which is not attracted to the substrate holder 240, exists.

Figure 6A:
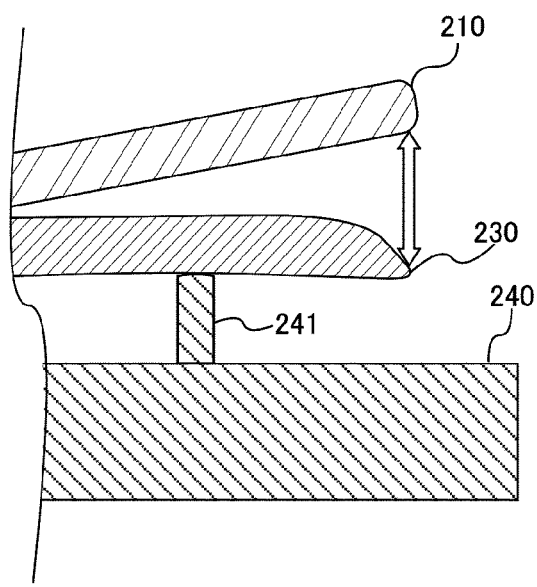
FIG. 6A is a schematic illustration for describing an example of a relationship between an outer peripheral droop and a warp of a substrate 230, and an interval between substrates 210, 230 on an outer peripheral side.
Figure 6B:
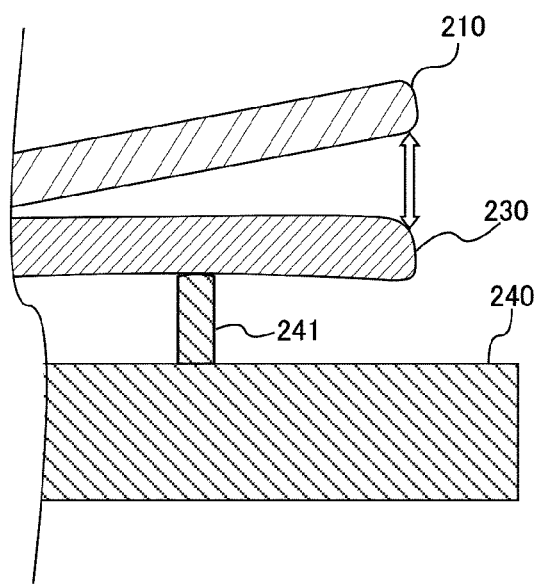
FIG. 6B is a schematic illustration for describing an example of the relationship between the outer peripheral droop and the warp of the substrate 230, and the interval between the substrates 210, 230 on the outer peripheral side.

FIG. 6A and FIG. 6B respectively show other different aspects of the outer peripheral droop of the substrates 230 to be bonded. The outer peripheral droop is a state in which a thickness of the outer peripheral portion is smaller than a thickness of the central portion, in the radial direction of the substrates 230 to be bonded. The central portion of the substrate 230 in the radial direction is a region including the center of the substrate 230, and the outer peripheral portion of the substrate 230 in the radial direction is a region outside the central portion of the substrate 230, a region between at least from a position where the BW between the substrates 210, 230 ends, to a position away by a predetermined distance inside the substrate 230, and a region including a position where the void is generated.

In the substrate 230 to be bonded by the substrate bonding device 100, for example, an outer peripheral portion of a wiring layer layered on the surface may be thinner than the central portion as a result of CMP (chemical mechanical polishing) after each time a film of the wiring layer is formed, and the thickness of the substrate 230 itself may decrease from the central portion toward the outer peripheral portion. The fact that the substrate 230 has such a change in thickness may be expressed as the substrate 230 has the outer peripheral droop, and a difference between the thickness of the central portion of the substrate 230 and the thickness of the outer peripheral portion may be referred to as an amount of droop.

The thickness of the central portion of the substrate 230 shown in FIG. 6A and the thickness of the central portion of the substrate 230 shown in FIG. 6B are the same. However, the thickness of the outer peripheral portion of the substrate 230 shown in FIG. 6B is larger than the thickness of the outer peripheral portion of the substrate 230 shown in FIG. 6A, in other words, the amount of droop of the outer peripheral droop is small. As a result, as indicated by white arrows in both drawings, for the substrate 230 with a small amount of droop or the substrate 230 including a location with a small amount of droop, the space between the substrate 210 and the substrate 230 is narrow entirely or partially on the outer peripheral side, and the risk of generating the adiabatic expansion void described above is high.

Figure 6C:
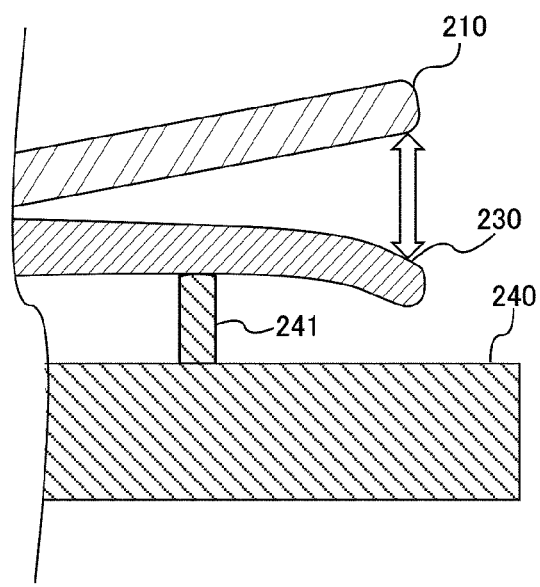
FIG. 6C is a schematic illustration for describing an example of the relationship between the outer peripheral droop and the warp of the substrate 230, and the interval between the substrates 210, 230 on the outer peripheral side.
Figure 6D:
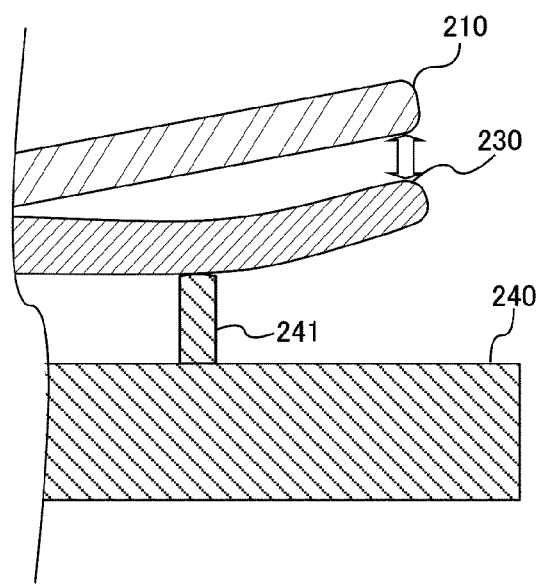
FIG. 6D is a schematic illustration for describing an example of the relationship between the outer peripheral droop and the warp of the substrate 230, and the interval between the substrates 210, 230 on the outer peripheral side.

FIG. 6C and FIG. 6D respectively show other different aspects of the warp in the outer peripheral portion of the substrates 230 to be bonded. The substrate 230 to be bonded by the substrate bonding device 100 may be unevenly curved in the plane, or may be curved uniformly in the entire plane. For example, the peripheral edge side of the substrate 230 may be warped in a recessed manner toward a bonding surface side. When such a substrate 230 is held by the substrate holder 240 of a vacuum attraction type having the annular wall portion 241 formed on an outermost periphery, in a case where there exists, in the substrate 230, a region which is positioned on the outer peripheral side further than the wall portion 241 and is not attracted to and is not held by the substrate holder 240, that is, the overhang portion exists, the overhang portion of the substrate 230 springs up, due to the warp in a recessed shape described above, to a substrate 210 side to be bonded.

The substrate 230 shown in FIG. 6D has a larger amount of warp of the warp at least partially than the substrate 230 shown in FIG. 6C. As a result, as indicated by the white arrows in both drawings, for the substrate 230 with a large amount of warp or the substrate 230 including a location with a large amount of warp, the space between the substrate 210 and the substrate 230 is narrow entirely or partially on the outer peripheral side, and the risk of generating the adiabatic expansion void is high.

It should be noted that FIG. 6A to FIG. 6D have described, as an example, the case where the substrate 230 held by the lower stage 332 has the outer peripheral droop or the warp; however, a description similar to the above description applies to a case where instead of the substrate 230, the substrate 210 held by the upper stage 322 has the outer peripheral droop or the warp, or a case where both of the substrate 210 and the substrate 230 that are held by the upper stage 322 and the lower stage 332 have the outer peripheral droops or the warps, as well, and thus the duplicate description will be omitted.

Figure 7:
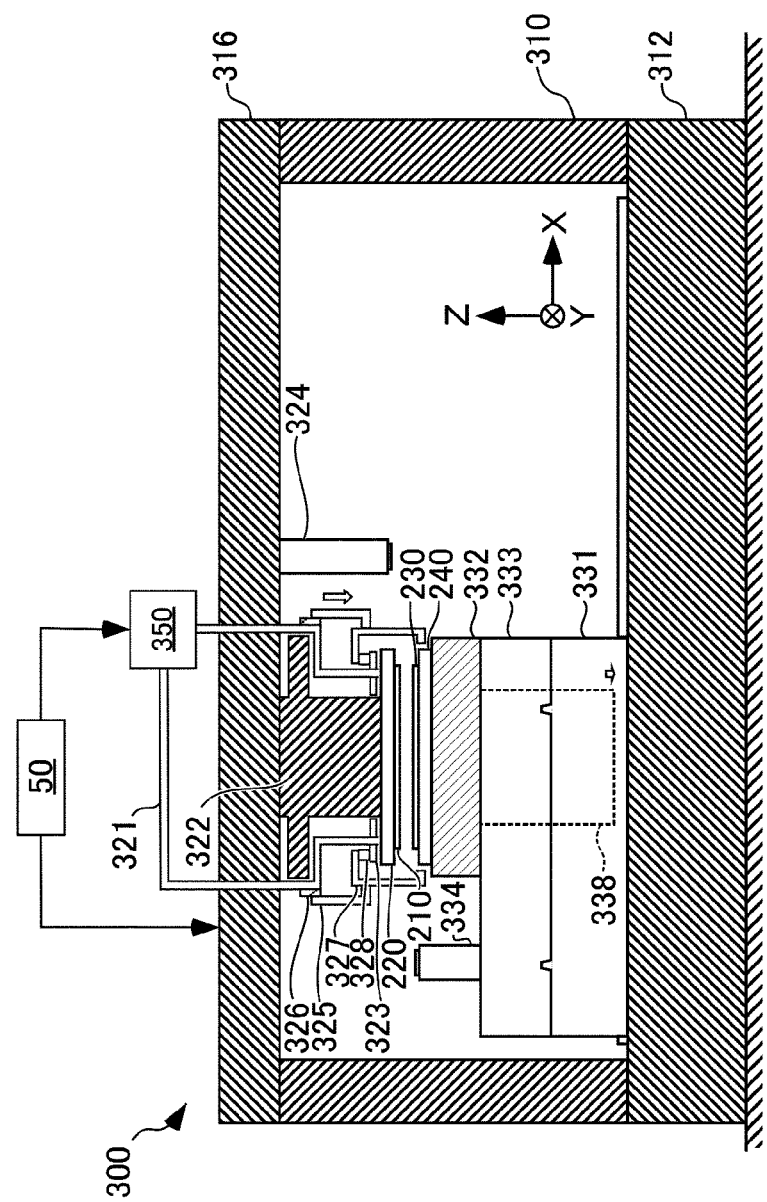
FIG. 7 is a schematic cross sectional view of the bonding portion 300 for describing an operation of the bonding portion 300 during the gas control step.

FIG. 7 is a schematic cross sectional view of the bonding portion 300 for describing an operation of the bonding portion 300 during the gas control step. The control device 50 operates the air cylinder portion 326 to lower the raising and lowering arm portion 325 and the cover portion for filling 327 down to the most negative side in the Z axis direction, as indicated by the white arrow in FIG. 7. Thereby, the cover portion for filling 327 surrounds the substrate 210 and the substrate 230 from the sides over the entire peripheries of the substrate 210 and the substrate 230 held in a state of facing each other by the upper stage 322 and the lower stage 332.

The control device 50 according to the present embodiment replaces the atmosphere, which exists between the substrates 210, 230, with the gas which is supplied into the bonding portion 300 by the gas supply portion 350 via the fixed pipe portion 321, before the contact between the substrates 210, 230 that are to be bonded to each other. Note that in the present embodiment, the control device 50 is configured to widen the interval between the substrates 210, 230 held by the upper stage 322 and the lower stage 332, after the substrates 210, 230, which are to be bonded to each other, are caused to face each other, and before the atmosphere, which exists between the substrates 210, 230 that are to be bonded to each other, is replaced with the gas from the gas supply portion 350. As an example, the control device 50 may increase the interval to be from 2 mm to 4 mm.

More specifically, following the state in which the substrates 210, 230, which are to be bonded to each other, are caused to face each other as shown in FIG. 4, the control device 50 operates the raising and lowering drive portion 338 to lower the lower stage 332 down in a negative direction of the Z axis, as indicated by the white arrow in FIG. 7, thereby widening the interval between the substrate 210 and the substrate 230. When the substrates 210, 230 are aligned with each other, typically, the distance between the substrates 210, 230 is narrow to prevent the misalignment between the substrates 210, 230 by minimizing a stage movement after the alignment as small as possible. When the distance is narrow, there is a risk that the space between the substrates 210, 230 is not quickly and sufficiently filled with the gas which is supplied between the substrates 210, 230 by the gas supply portion 350, due to viscosity. Therefore, by widening the interval between the substrate 210 and the substrate 230 before the atmosphere, which exists between the substrates 210, 230 that are to be bonded to each other, is replaced with the gas from the gas supply portion 350, the control device 50 according to the present embodiment can set a state in which the space between the substrates 210, 230 is able to be quickly and sufficiently filled with the gas from the gas supply portion 350. It should be noted that at a time when the detection of the alignment marks of the two substrates 210, 230 is completed, or at a time when the alignment of the two substrates 210, 230 is completed, in a case where the interval between the substrates 210, 230 has a size for being able to be filled with the gas, the interval between the substrate 210 and the substrate 230 may not be further widened before the replacement with the gas.

The control device 50 is configured to control the supply condition of the gas which is supplied between the substrates 210, 230 before the contact between the two substrates 210, 230 that are to be bonded to each other. The control device 50 is further configured to control the supply condition described above according to a measurement result obtained by the measurement in relation to the substrate 210, the substrate 230, or the substrate bonding device 100. The supply condition may be, as an example, at least any of a supply flow rate, a supply pressure, a supply time, a supply direction, a humidity, a temperature, or a discharge flow rate of the gas.

In the present embodiment, as shown in FIG. 8A to FIG. 10B which will be described below, the plurality of fixed pipe portions 321 are able to send gases, from various directions, to the substrates 210, 230 that are to be bonded to each other in the bonding portion 300. In FIG. 8A to FIG. 10B, for the purpose of clarifying the description, the respective fixed pipe portions 321, which supply the gas to the bonding portion 300 through routes similar to each other, are illustrated with reference to separate drawings; however, the bonding portion 300 according to the present embodiment includes all of the fixed pipe portions 321 shown in FIG. 8A to FIG. 10B. Therefore, the control device 50 according to the present embodiment is able to adjust the supply flow rate, the supply pressure, the supply time, the supply direction, the humidity, and the temperature of the gas which is supplied into the bonding portion 300 from the gas supply portion 350, through some or all of the plurality of fixed pipe portions 321 provided with valves capable of individually adjusting the flow rate. It should be noted that the bonding portion 300 may include only some of the plurality of fixed pipe portions 321 shown in FIG. 8A to FIG. 10B.

Figure 8A:
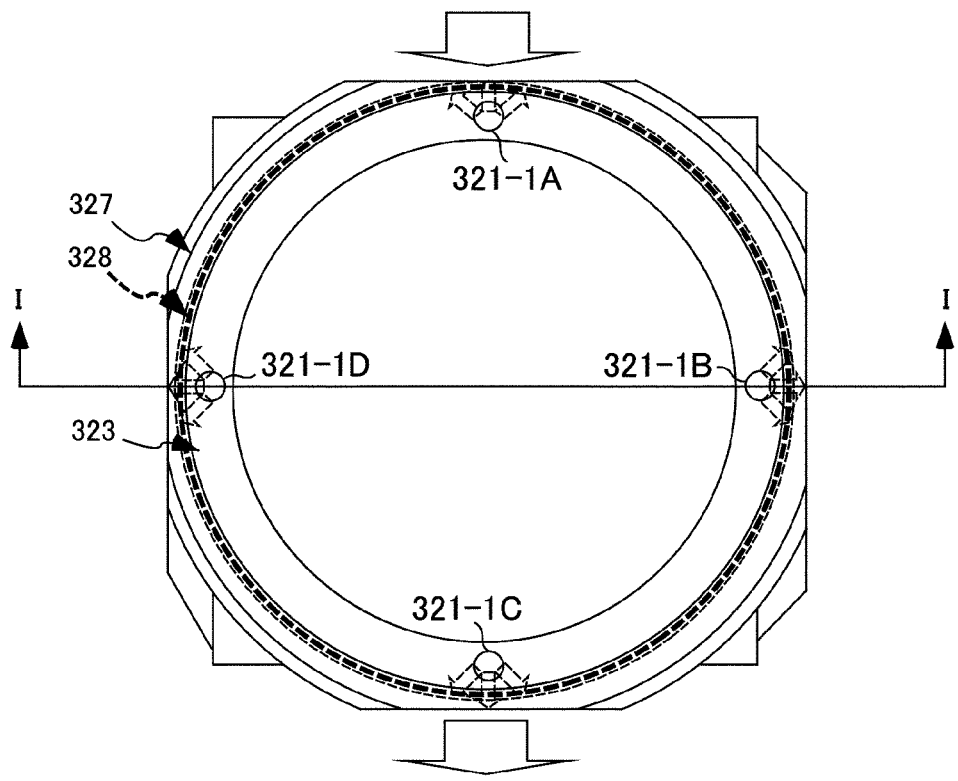
FIG. 8A is a schematic plan view for describing a gas supply method by fixed pipe portions 321-1A to 321-1D.
Figure 8B:
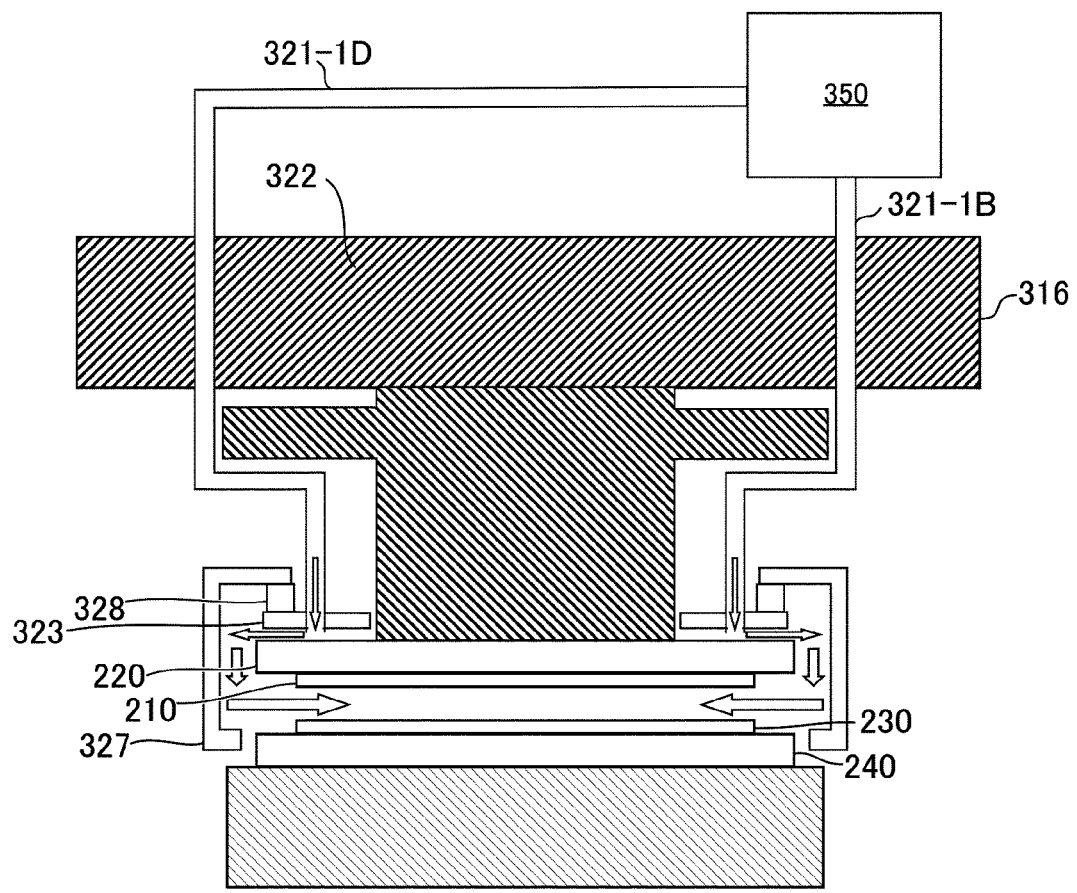
FIG. 8B is a schematic cross sectional view for describing the gas supply method by the fixed pipe portions 321-1A to 321-1D.

FIG. 8A is a schematic plan view for describing a gas supply method by fixed pipe portions 321-1A to 321-1D. FIG. 8B is a schematic cross sectional view for describing the gas supply method by the fixed pipe portions 321-1A to 321-1D. FIG. 8A shows, by solid lines, the fixed pipe portions 321-1A to 321-1D, the cover portion for filling 327, and the top plate for filling 323 when viewed from a positive direction of the Z axis. Note that in the top plate for filling 323 in a case of being viewed from the same direction, an outline of a portion, which is hidden by the top plate 343 of the cover portion for filling 327, is indicated by a thin dashed line. In addition, the sealing member 328 in a case of being viewed from the same direction is indicated by a thick dashed line.

FIG. 8B schematically shows, by extractions in the bonding portion 300, a cross section of the cover portion for filling 327 or the like taken along a I-I line shown in FIG. 8A, and cross sections of the upper stage 322, the lower stage 332, the substrates 210, 230, and the substrate holders 220, 240, together with the gas supply portion 350 connected to one end of each of the fixed pipe portions 321-1A to 321-1D.

In addition, in FIG. 8A and FIG. 8B, the flows of the gases, which are supplied from the gas supply portion 350 into the bonding portion 300 via the fixed pipe portions 321-1A to 321-1D, are indicated by white thin arrows. In addition, in FIG. 8A and FIG. 8B, the side flow described above is indicated by a thickest white arrow. As shown in FIG. 8A and FIG. 8B, in the present embodiment, the side flow flows in one direction from an upper side to a lower side in the drawing. The above descriptions in relation to FIG. 8A and FIG. 8B are similar to those of FIG. 9A, FIG. 9B, FIG. 10A, and FIG. 10B which will be described below, and the duplicate descriptions will be omitted.

The one end of each of the fixed pipe portions 321-1A to 321-1D extending in the bonding portion 300 is coupled to the top plate for filling 323. More specifically, the one end of the fixed pipe portion 321-1A is coupled to an upstream side of the side flow in the top plate for filling 323, and the one end of the fixed pipe portion 321-1C is coupled to a downstream side of the side flow in the top plate for filling 323. In addition, near the middle of a position where the fixed pipe portion 321-1A is coupled, and a position where the fixed pipe portion 321-1C is coupled, in the top plate for filling 323, the one end of the fixed pipe portion 321-1B and the one end of the fixed pipe portion 321-1D are positioned at both ends opposite to each other.

The gases which are supplied from the gas supply portion 350 via the fixed pipe portions 321-1A to 321-1D are discharged, in the negative direction of the Z axis, toward the surface of the substrate holder 220 on which the substrate 210 is not placed, and are diffused outwards in the radial direction along the surface of the substrate holder 220. The gases which are supplied from the fixed pipe portions 321-1A to 321-1D may have comparatively low flow rates.

A space between the lower surface of the top plate 343 of the cover portion for filling 327, and the upper surface of the top plate for filling 323 is sealed with the sealing member 328. In the present embodiment, the gas which is supplied into the bonding portion 300 by the gas supply portion 350 is a helium gas. Therefore, the gas diffused outwards in a radial direction along the back surface of the substrate holder 220 fills the space between the substrate holder 220 and the cover portion for filling 327 from above. In other words, the gas gradually replaces the atmosphere existing between the substrate holder 220 and the cover portion for filling 327 from a positive direction side of the z direction.

As the replacement progresses, the gas reaches the negative side in the Z axis direction of the bonding surfaces of the substrate 210, and flows between the substrate 210 and the substrate 230. At this time, the gas is affected by the side flow as well, and efficiently flows between the substrates 210, 230 to replace the atmosphere existing between the substrates 210, 230.

With the gas supply method by the fixed pipe portions 321-1A to 321-1D, a time required to replace, with the gas, the atmosphere existing between the substrates 210, 230 is comparatively long: however, the gases are not directly sent from the fixed pipe portions 321-1A to 321-1D toward the space between the substrates 210, 230, and thus a particle which may be included in the gas has a small influence on the bonding surfaces of the substrates 210, 230.

Figure 9A:
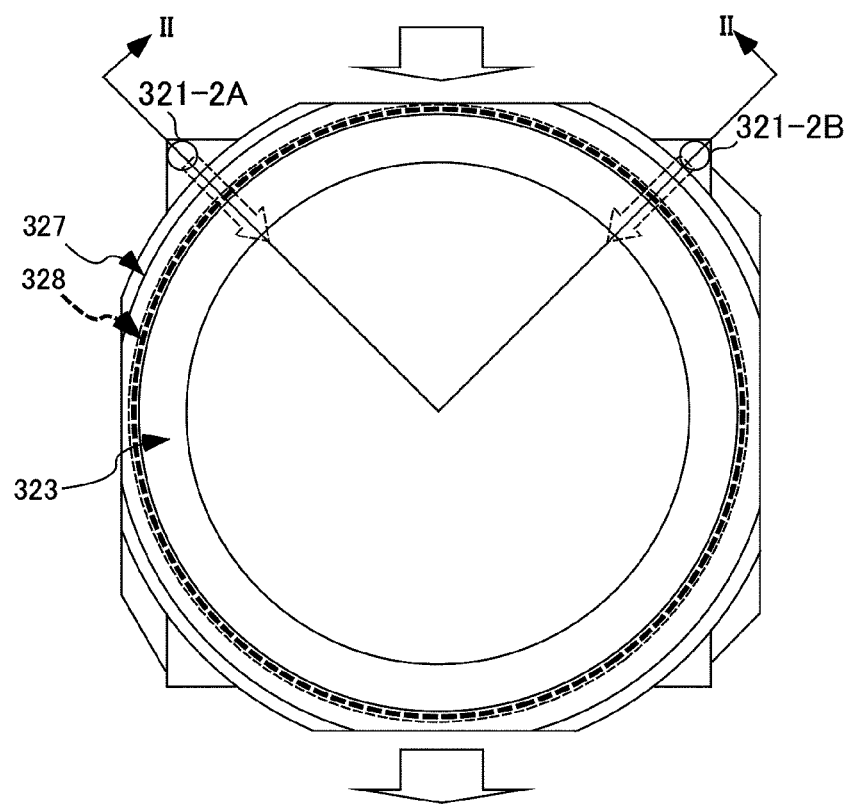
FIG. 9A is a schematic plan view for describing the gas supply method by fixed pipe portions 321-2A to 321-2B.
Figure 9B:
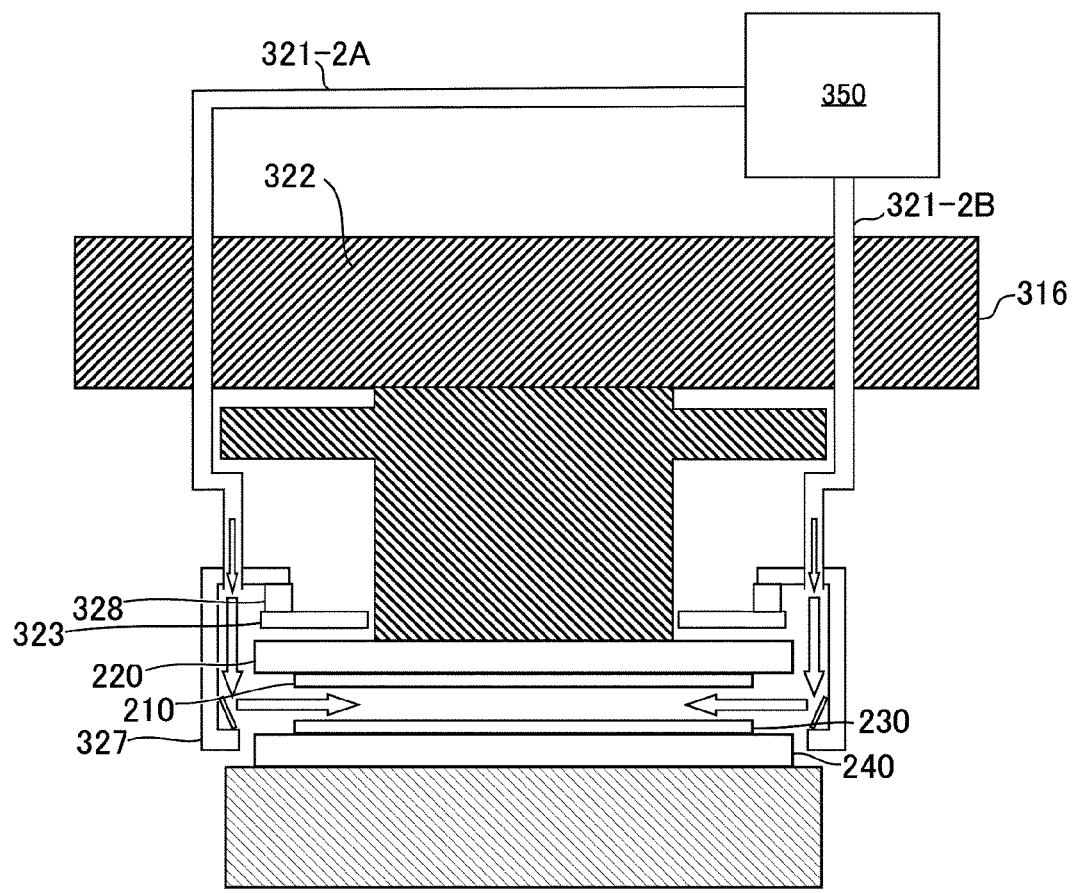
FIG. 9B is a schematic cross sectional view for describing the gas supply method by the fixed pipe portions 321-2A to 321-2B.

FIG. 9A is a schematic plan view for describing the gas supply method by fixed pipe portions 321-2A to 321-2B. FIG. 9B is a schematic cross sectional view for describing the gas supply method by the fixed pipe portions 321-2A to 321-2B. FIG. 9B schematically shows, by extractions in the bonding portion 300, a cross section of the cover portion for filling 327 or the like taken along a II-II line shown in FIG. 9A, and cross sections of the upper stage 322, the lower stage 332, the substrates 210, 230, and the substrate holders 220, 240, together with the gas supply portion 350 connected to one end of each of the fixed pipe portions 321-2A to 321-2B.

The one end of each of the fixed pipe portions 321-2A to 321-2B extending in the bonding portion 300 is coupled to the top plate 343 of the cover portion for filling 327. More specifically, the one end of the fixed pipe portion 321-2A and the one end of the fixed pipe portion 321-2B are coupled to both ends opposite to each other in the top plate 343 of the cover portion for filling 327, on the upstream side of the side flow. It should be noted that when no side flow is flowing in the bonding portion 300, the one end of each of the fixed pipe portion 321-2A and the fixed pipe portion 321-2B may be, for example, coupled to both ends opposite to each other in the top plate 343 of the cover portion for filling 327, on an opposite side of a gas exhaust port of the gas in the bonding portion 300. When the side flow is flowing in the bonding portion 300, it is preferable to determine, according to a flow direction of the side flow, the coupling positions of the one end of the fixed pipe portion 321-2A and the one end of the fixed pipe portion 321-2B in the top plate 343 of the cover portion for filling 327.

As described above, the cover portion for filling 327 moves in the Z axis direction with respect to the upper stage 322. Therefore, the one end of the fixed pipe portion 321-2A and the one end of the fixed pipe portion 321-2B may be, for example, coupled to the top plate 343 of the cover portion for filling 327 via hinges such that the fixed pipe portion 321-2A or the like does not interfere with the movement of the cover portion for filling 327 when the cover portion for filling 327 moves. Instead of this, the fixed pipe portion 321-2A and the fixed pipe portion 321-2B may move together with the cover portion for filling 327, or may be formed of a material having flexibility to expand and contract accompanying the movement of the cover portion for filling 327.

The gases which are supplied from the gas supply portion 350 via the fixed pipe portions 321-2A to 321-2B are discharged in the negative direction of the Z axis toward an upper surface of the bottom plate 345 of the cover portion for filling 327, are reflected by a reflective plate installed at the upper surface of the bottom plate 345, and flow toward the center side between the substrates 210, 230. At this time, the gas is affected by the side flow as well, and efficiently flows between the substrates 210, 230 to replace the atmosphere existing between the substrates 210, 230.

With the gas supply method by the fixed pipe portions 321-2A to 321-2B, it is possible to comparatively shorten the time required to replace, with the gas, the atmosphere existing between the substrates 210, 230. In addition, with the gas supply method, the gas flows from the respective fixed pipe portion 321-2A and the fixed pipe portion 321-2B toward the center side between the substrates 210, 230 are also affected by the side flow, to move together toward the downstream side of the side flow without reducing a flow velocity, and thus it is difficult for the particle, which may be included in the gas, to stay between the substrates 210, 230, and the particle has a small influence on the bonding surfaces of the substrates 210, 230.

Figure 10A:
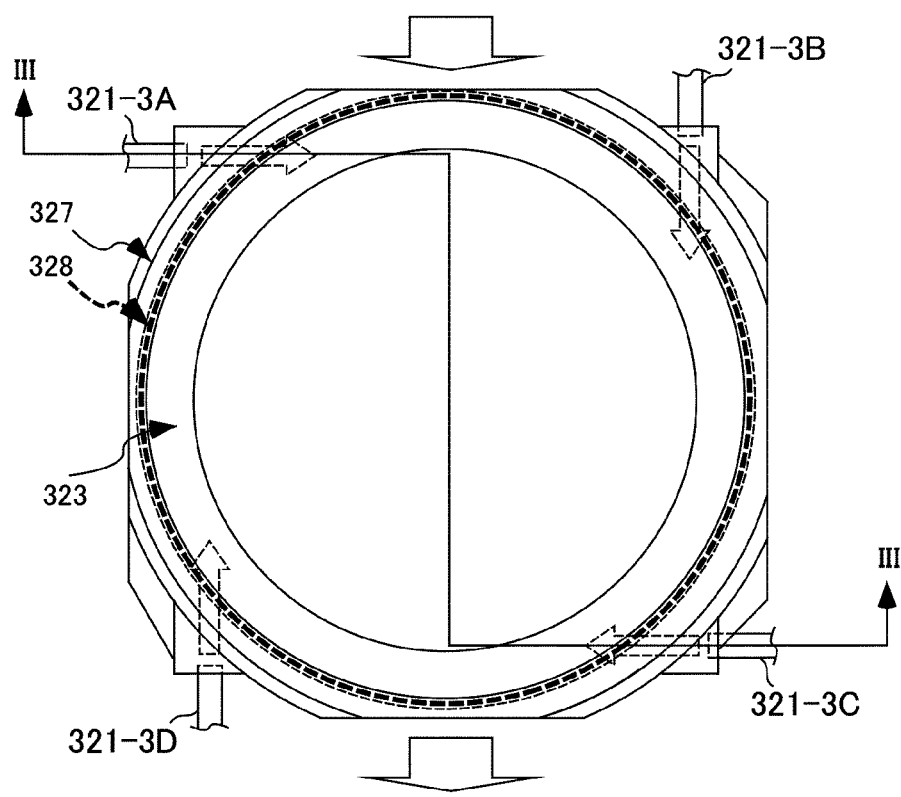
FIG. 10A is a schematic plan view for describing the gas supply method by fixed pipe portions 321-3A to 321-3D.
Figure 10B:
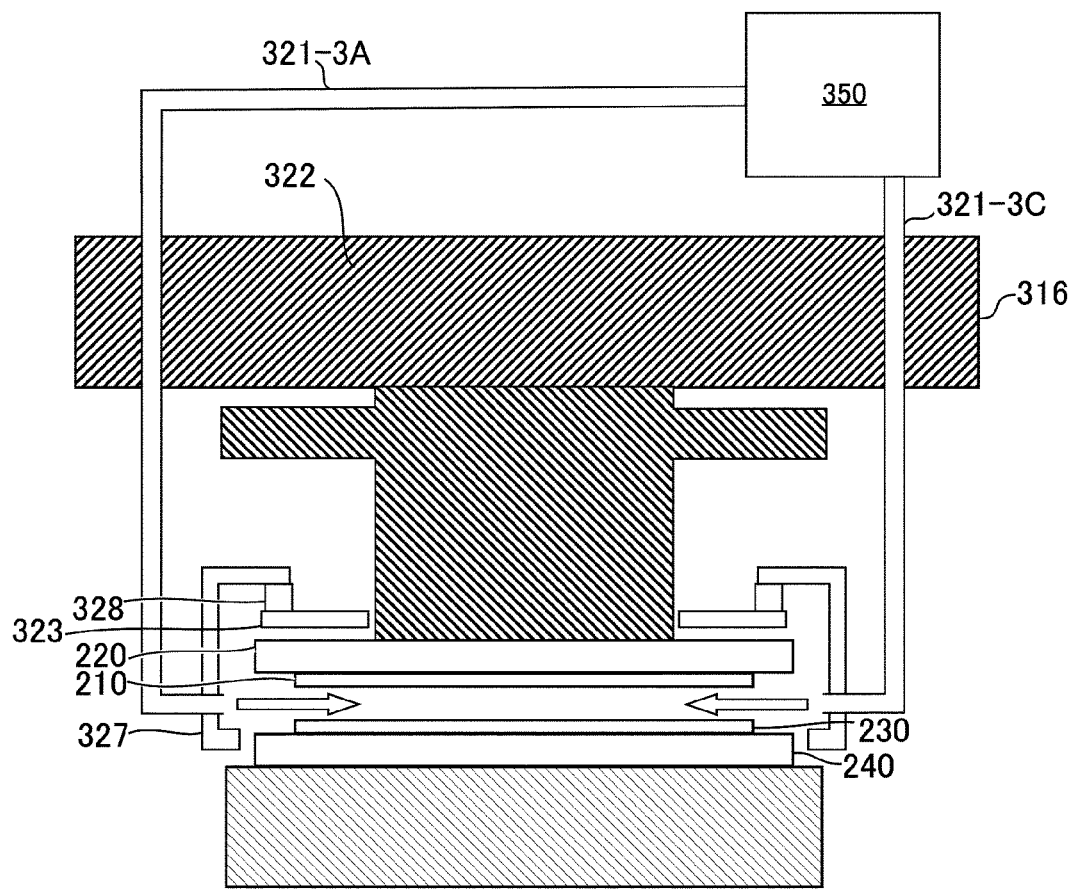
FIG. 10B is a schematic cross sectional view for describing the gas supply method by the fixed pipe portions 321-3A to 321-3D.

FIG. 10A is a schematic plan view for describing the gas supply method by fixed pipe portions 321-3A to 321-3D. FIG. 10B is a schematic cross sectional view for describing the gas supply method by the fixed pipe portions 321-3A to 321-3D. FIG. 10B schematically shows, by extractions in the bonding portion 300, a cross section of the cover portion for filling 327 or the like taken along a III-III line shown in FIG. 10A, and cross sections of the upper stage 322, the lower stage 332, the substrates 210, 230, and the substrate holders 220, 240, together with the gas supply portion 350 connected to one end of each of the fixed pipe portions 321-3A to 321-3D.

The one end of each of the fixed pipe portions 321-3A to 321-3D extending in the bonding portion 300 is coupled to the side wall 341 of the cover portion for filling 327. More specifically, the one end of the fixed pipe portion 321-3A and the one end of the fixed pipe portion 321-3B are coupled to both ends opposite to each other in the side wall 341 of the cover portion for filling 327, on the upstream side of the side flow. Note that the fixed pipe portion 321-3A supplies the gas in tangential directions of the outer peripheries of the substrates 210, 230 from right beside the flow direction of the side flow, and the fixed pipe portion 321-3B supplies the gas in the tangential directions of the substrates 210, 230 parallel to the flow direction of the side flow.

The one end of the fixed pipe portion 321-3C and the one end of the fixed pipe portion 321-3D are coupled to both ends opposite to each other in the side wall 341 of the cover portion for filling 327, on the downstream side of the side flow. Note that the fixed pipe portion 321-3C supplies the gas in the tangential directions of the outer peripheries of the substrates 210, 230 from right beside the flow direction of the side flow, and the fixed pipe portion 321-3D supplies the gas in the tangential directions of the substrates 210, 230 parallel to the flow direction of the side flow.

Similar to the fixed pipe portion 321-2A or the like, the one end of the fixed pipe portion 321-3A to one end of the fixed pipe portion 321-3D may be, for example, coupled to the side wall 341 of the cover portion for filling 327 via the hinges such that the fixed pipe portion 321-3A or the like does not interfere with the movement of the cover portion for filling 327 when the cover portion for filling 327 moves. Instead of this, the fixed pipe portion 321-3A to the fixed pipe portion 321-3D may move together with the cover portion for filling 327, or may be formed of a material having flexibility to expand and contract accompanying the movement of the cover portion for filling 327.

The gases supplied from the gas supply portion 350 via the fixed pipe portions 321-3A to 321-3D are discharged from four different directions in the tangential directions of the outer peripheries of the substrates 210, 230, that is, flow into the cover portion for filling 327 in a spiral way. At this time, the gas is affected by the side flow as well, and efficiently flows between the substrates 210, 230 to replace the atmosphere existing between the substrates 210, 230.

With the gas supply method using the fixed pipe portions 321-3A to 321-3D, it is possible to directly supply the gas toward the outer peripheral side, on which the void is easily generated, between the substrates 210, 230. In addition, it is suitable for filling the space between the substrates 210, 230 with low cost CDA or nitrogen.

As described above, the control device 50 controls the supply condition described above according to the measurement result obtained by the measurement in relation to the substrate 210, the substrate 230, or the substrate bonding device 100. In the present embodiment, the measurement result may include, for example, an aspect of the thickness of the outer peripheral portion of the substrate 230 or the like. The aspect of the thickness of the outer peripheral portion referred to here may be, as an example, an aspect of the outer peripheral droop described above. The measurement result may also include, for example, an aspect of the warp in the outer peripheral portion of the substrate 230 or the like.

The measurement results may also include, for example, an aspect of the BW that is generated between the substrates 210, 230 during a bonding step. The measurement result may also include, for example, an aspect of the void generated in the outer peripheral portions of the substrates 210, 230 that are bonded to each other. The measurement results may also include, for example, an aspect of the bonding between the substrates 210, 230 that are bonded to each other.

The measurement results may also include, for example, the interval between the substrates 210, 230 during the bonding step. The measurement results may also include, for example, the relative positions in the bonding direction (the z axis direction) of the upper stage 322 and the lower stage 332 holding the substrates 210, 230 during the bonding step. The relative position referred to here may be, for example, a difference between a Z axis coordinate of the fixed upper stage 322 and a Z axis coordinate of the lower stage 332 of a movable type, or may be a difference of at least one of an X axis coordinate or a Y axis coordinate.

The measurement result may also be, for example, spatial coordinates of the lower stage 332 of the movable type holding the substrate 230 during the bonding step, or may be the Z axis coordinate of the lower stage 332, or may be at least one of the X axis coordinate or the Y axis coordinate of the lower stage 332. The measurement result may also be, for example, a combination of the examples of the plurality of measurement results described above.

As an example, the control device 50 according to the present embodiment is configured to supply the gas, at at least any of a relatively high supply flow rate, a relatively high supply pressure, or a relatively high temperature, to at least any location of a location where the thickness is relatively small, or a location where an amount of warp of the warp is relatively large, in the outer peripheral portion of the substrate 230 or the like to be bonded. In this case, the control device 50 may supply the gases from a plurality of locations at equal intervals over the entire space between the substrates 210, 230 that are to be bonded to each other, that is, the entire peripheries of the substrates 210, 230. In addition, the control device 50 may supply the gas toward the location where the thickness is small, or the location where the amount of warp is large, which is described above, while not supplying the gas toward other locations. It should be noted that in this case, the gas may spread sequentially to the other locations. In addition, in the following embodiments, when the gas is supplied, at a relatively different supply flow rate, supply pressure, or supply temperature, to a specific location in the outer peripheral portion of the substrate 230 or the like, similar to the gas supply method described above, the gas may be blown toward the entire peripheries of the substrates 210, 230, or the gas may be blown toward parts of the entire peripheries of the substrates 210, 230 while the gas is not directly blown to the rest of the entire peripheries.

As an example, the control device 50 according to the present embodiment is configured to supply the gas toward at least any location of the location where the thickness is relatively small, or the location where the amount of warp of the warp is relatively large, in the outer peripheral portion of the substrate 230 or the like to be bonded. In this case, the control device 50 supplies the gas toward a location where the amount of droop is small, or the location where the amount of warp is large, which is described above, while not supplying the gas toward other locations. It should be noted that in this case, the gas may spread sequentially to the other locations. In addition, in the following embodiments, when the gas is blown toward a specific location in the outer peripheral portion of the substrate 230 or the like, similar to the gas supply method described above, the gas may not be directly blown to a location other than the specific location.

Figure 11:
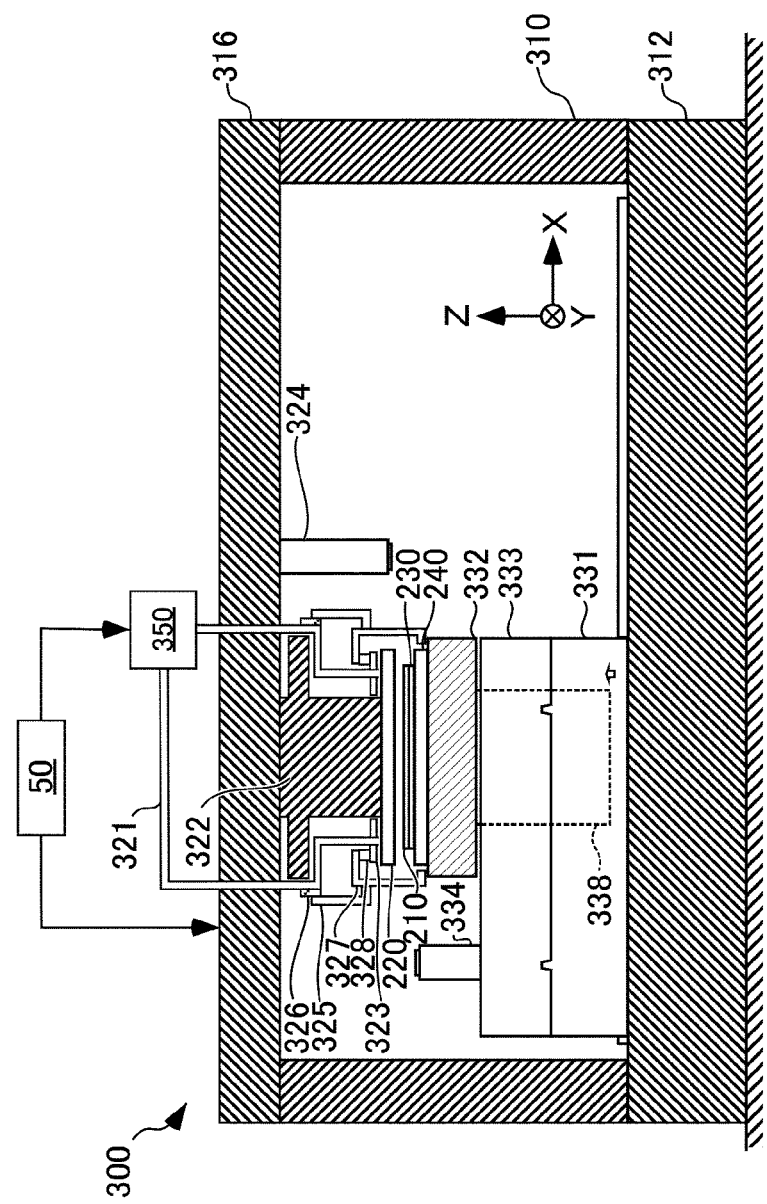
FIG. 11 is a schematic cross sectional view of the bonding portion 300 for describing the operation of the bonding portion 300 during the gas control step.

FIG. 11 is a schematic cross sectional view of the bonding portion 300 for describing the operation of the bonding portion 300 during the gas control step. Following the state shown in FIG. 7, as shown in FIG. 11, the control device 50 operates the raising and lowering drive portion 338 to raise the lower stage 332 and cause the substrate 210 and the substrate 230 to be close to each other. Then, after a part of the substrate 230 and a part of the substrate 210 are brought into contact with each other to form the contact region, the BW is generated by releasing the holding of the substrate 210 by the upper stage 322 via the substrate holder 220, and the substrate 230 and the substrate 210 are bonded to each other by the contact region being caused to expand.

The control device 50 supplies the gas from the gas supply portion 350 to the space between the substrates 210, 230 even after the contact between the substrates 210, 230. The control device 50 further controls, as before the contact between the substrates 210, 230, the supply condition of the gas which is supplied after the contact between the substrates 210, 230 according to the measurement result obtained by the measurement in relation to the substrate 210, the substrate 230, or the substrate bonding device 100.

The control device 50 according to the present embodiment supplies the gas to the space between the substrates 210, 230 until the contact region reaches the outer peripheral sides of the substrates 210, 230 after the contact between the substrates 210, 230. The control device 50 according to the present embodiment further controls the supply condition of the gas which is supplied between the substrates 210, 230 until the contact region reaches the outer peripheral sides according to the measurement result obtained by the measurement in relation to the substrate 210, the substrate 230, or the substrate bonding device 100.

As an example, the control device 50 according to the present embodiment is configured to supply the gas, at at least any of a relatively high supply flow rate, a relatively high supply pressure, or a relatively high temperature, to a location where a progression of the BW is relatively fast, in the outer peripheral sides of the substrates 210, 230 during the bonding step. This is because, as described above, the higher the BW speed, the higher the risk of generating the adiabatic expansion void.

As an example, the control device 50 according to the present embodiment is configured to supply the gas toward the location where the progression of the BW is relatively fast, in the outer peripheral sides of the substrates 210, 230 during the bonding step.

As an example, the control device 50 according to the present embodiment is configured to cause the gas to be supplied, at at least any of a relatively high supply flow rate, a relatively high supply pressure, or a relatively high temperature, to a substrate holding position in the substrate bonding device 100 corresponding to at least any location of a location where a relatively large number of voids are generated, or a location where the bonding is released and the peeling occurs, in the outer peripheral portions of the substrates 210, 230 that are bonded to each other. As an example, the control device 50 according to the present embodiment is configured to cause the gas to be supplied toward the substrate holding position in the substrate bonding device 100 corresponding to at least any location of the location where a relatively large number of voids are generated, or the location where the bonding is released and the peeling occurs, in the outer peripheral portions of the substrates 210, 230 that are bonded to each other. That is, in any of these examples, the control device 50 performs a feedback control according to the bonding state measured after the bonding between the substrates 210, 230.

In this case, feedback control may be performed when the substrates 210, 230, which are bonded to each other, are peeled to be separated, and are bonded to each other again, or feedback control may be performed when the substrates 210, 230, which are next targets of the bonding to each other, are bonded to each other. In the latter case, it is preferable for the control device 50 to perform, for example, the feedback control on the substrates 210, 230 in the same lot as the substrates 210, 230 that are bonded to each other, or the substrates 210, 230 manufactured by the same manufacturing process. It should be noted that the substrate holding position described above is intended to be a corresponding location in the outer peripheral portions of the substrates 210, 230 to be held by the upper stage 322 and the lower stage 332 from the next time onwards. An example of the corresponding location includes a location where a notch is formed, a location facing a hole formed for a lift up pin to be inserted into, in the substrate holder 240 or the like, or the like.

With the present embodiment described above, the control device 50 controls the supply condition of the gas which is supplied between the substrates 210, 230 before the contact between the two substrates 210, 230 that are to be bonded to each other by the substrate bonding device 100. The control device 50 further controls the supply condition described above according to the measurement result obtained by the measurement in relation to the substrate 210, the substrate 230, or the substrate bonding device 100. This makes it possible for the control device 50 to efficiently reduce the voids generated in the outer peripheral portions of the substrates 210, 230 that are to be bonded to each other.

For example, the control device 50 acquires the measurement result indicating that the outer peripheral portion of one or both of the substrate 210 and the substrate 230, which are to be bonded to each other, is largely warped as a whole for the bonding surfaces to be recessed, or the measurement result indicating that a type of a film on the bonding surface of one or both of the substrate 210 and the substrate 230, which are to be bonded to each other, is hygroscopic. In this case, the control device 50 can increase a filling rate of the inert gas, or the gas of which the humidity is controlled, at least on the outer peripheral side between the substrates 210, 230 that are to be bonded to each other, by increasing the supply flow rate of the gas which is supplied between the substrates 210, 230 that are to be bonded to each other, increasing the supply pressure, or lengthening the supply time according to the measurement result. In addition, in the case described above, the control device 50 can reduce the humidity of the gas which is supplied between the substrates 210, 230 that are to be bonded to each other, or increase the temperature, according to the measurement result. In addition, in the above case, the control device 50 may additionally or alternatively reduce the discharge flow rate of the gas which is supplied between the substrates 210, 230 that are to be bonded to each other, according to the measurement result. It can be said that by any method, it is possible for the control device 50 to efficiently reduce the voids generated in the outer peripheral portions of the substrates 210, 230 that are to be bonded to each other.

In addition, for example, the control device 50 acquires the measurement result indicating that the outer peripheral droop in the outer peripheral portion of one or both of the substrate 210 and the substrate 230, which are to be bonded to each other, has a large amount of droop as a whole. In other words, the measurement result, which indicates that the risk of generating the void in the outer peripheral portions of the substrates 210, 230 that are to be bonded to each other, is very low, is acquired. In this case, the control device 50 can reduce the amount of use of the gas, reduce a cost, and reduce an adverse effect of the gas on other equipment, by reducing the supply flow rate of the gas which is supplied between the substrates 210, 230 that are to be bonded to each other, reducing the supply pressure, or shortening the supply time, according to the measurement result. In addition, in this case described above, the control device 50 can reduce the cost by reducing the temperature of the gas which is supplied between the substrates 210, 230 that are to be bonded to each other, according to the measurement result, that is, suppressing heating of the gas. It can be said that by any method, it is possible for the control device 50 to efficiently reduce the voids generated in the outer peripheral portions of the substrates 210, 230 that are to be bonded to each other.

In addition, for example, the control device 50 acquires the measurement result indicating that many voids are generated as a whole in the outer peripheral portions of the substrates 210, 230 that are bonded to each other, or the measurement result indicating that peeling has occurred during a CMP process. In this case, when the substrates 210, 230 are bonded to each other again, or when the substrates 210, 230, which are the next targets of the bonding to each other, are bonded together, the control device 50 can increase the filling rate of the inert gas, or the gas of which the humidity is controlled, at least on the outer peripheral side between the substrates 210, 230 that are to be bonded to each other from the next time onwards, by resetting to increase the supply flow rate of the gas which is supplied between the substrates 210, 230 that are to be bonded to each other, to increase the supply pressure, or to lengthen the supply time, according to the measurement result. In addition, in the case described above, the control device 50 can reduce the humidity of the gas which is supplied between the substrates 210, 230 that are to be bonded to each other from the next time onwards, or increase the temperature, according to the measurement result. In addition, in the case described above, the control device 50 may additionally or alternatively reduce the discharge flow rate of the gas which is supplied between the substrates 210, 230 that are to be bonded to each other from the next time onwards, according to the measurement result. By any method, it is possible for the control device 50 to efficiently reduce the voids generated in the outer peripheral portions of the substrates 210, 230 that are to be bonded to each other from the next time onwards.

It should be noted that in the layered substrate 201 manufactured by bonding the substrates 210, 230 to each other, a portion on the center side further than the position where the BW ends may be used as a product, and a portion on the outer peripheral side further than the position may not be used as the product, and with the control device 50, it is possible to reduce the risk of generating the void in the portion that is used as the product of the layered substrate 201, and thus it is possible to enhance a yield of the product.

It should be noted that the substrate bonding device 100 may measure at least any of an aspect of the thickness of the outer peripheral portion of the substrate 230 or the like, an aspect of the warp in the outer peripheral portion of the substrate 230 or the like, an aspect of the BW that is generated between the substrates 210, 230 during the bonding step, an aspect of the void generated in the outer peripheral portions of the substrates 210, 230 that are bonded to each other, or an aspect of the bonding between the bonded substrates 210, 230 that are bonded to each other. In this case, the control device 50 may acquire the measurement result from the substrate bonding device 100. It should be noted that instead of this, the control device 50 itself may perform the measurement.

The substrate 230 may warp non-uniformly in the plane, or may warp uniformly over the entire plane. In addition, the amount of warp (degree of the warp) may be unique to each substrate 230 and the like, or may be unique to a group of a plurality of substrates 230 and the like, for example, a rod in which the plurality of substrates 230 and the like are layered for storage, a group of substrates that have undergone the same manufacturing process, or a group of substrates that have the same crystal orientation, or the like.

When the degree of the warp is unique to each substrate 230, the degree of the warp is measured, for example, before or after loading into the substrate bonding device 100. When the degree of the warp is unique to each group of the plurality of substrates 230, the measurement result obtained by the measurement for the first substrate may be applied to another substrate in the same group. As an example, the control device 50 may acquire, for each group in advance, information indicating a location where the void is easily generated, and uniformly use the same gas supply method to the group of substrates of the same type, the group of substrates that have the same crystal orientation, or the group of substrates that have undergone the same manufacturing process.

FIG. 12A to FIG. 12D are schematic plan views for describing, as examples, the gas supply pattern when the interval between the substrates 210, 230 is larger than or equal to a predetermined size during a bonding step. In addition, FIG. 13A to FIG. 13D are schematic plan views for describing, as examples, the gas supply pattern when the interval between the substrates 210, 230 is smaller than a predetermined size during the bonding step.

The control device 50 according to the present embodiment controls the supply condition described above of the gas which is supplied from the gas supply portion 350, according to at least any of the interval between the substrates 210, 230 during the bonding step, or the relative positions of the upper stage 322 and the lower stage 332 holding the substrates 210, 230, in the bonding direction, during the bonding step. The control device 50 according to the present embodiment is configured to switch the supply condition of the gas which is supplied between the substrates 210, 230 according to the change of the interval between the substrates 210, 230 that are to be bonded to each other by the substrate bonding device 100. It should be noted that switching the supply condition of the gas which is supplied between the substrates 210, 230 may mean switching the gas supply condition while supplying of the gas to the space between the substrates 210, 230 continues. In this case, for example, on a premise that the gas is supplied before the contact between the substrates 210, 230, the control device 50 may switch the gas supply condition according to the change of the interval between the substrates 210, 230.

More specifically, the control device 50 is configured to supply the gas such that the gas flows in the center between the two substrates 210, 230 in the plane direction, that is, between portions brought into contact with each other at a time when a starting point is formed, in at least any case of a case where the interval described above is larger than or equal to a predetermined size, or a case where the relative positions described above are away from each other by a predetermined size or more. In this case, when the side flow described above flows in the bonding portion 300 in one direction, the control device 50 supplies the gas from the upstream side of the side flow. At this time, the gas is affected by the side flow as well, and efficiently flows between the substrates 210, 230 to replace the atmosphere existing between the substrates 210, 230. It should be noted that the predetermined size may be at least one of a size by which the gas is able to fill or is able to flow in between the substrates 210, 230, a size by which the flow of the gas is able to be formed in the central portion of the substrates 210, 230, or a size by which the gas is able to replace a fluid between the substrates 210, 230, and is set by a type of gas that flows in, a material of the substrate, a surrounding environment, and the like.

Figure 12A:
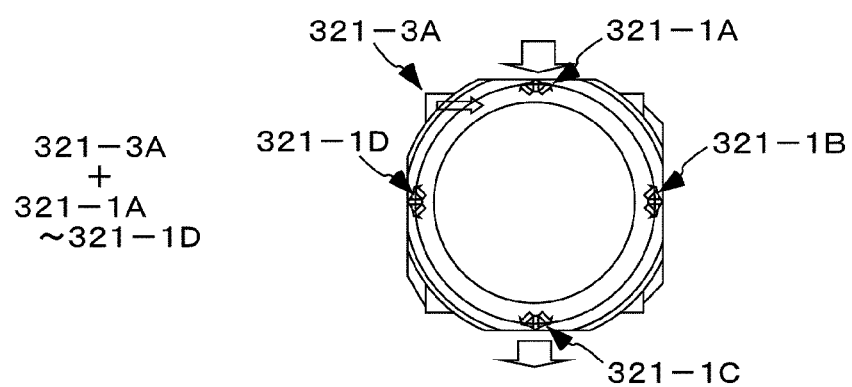
FIG. 12A is a schematic plan view for describing, as an example, a gas supply pattern when the interval between the substrates 210, 230 is large during a bonding step.
Figure 12B:
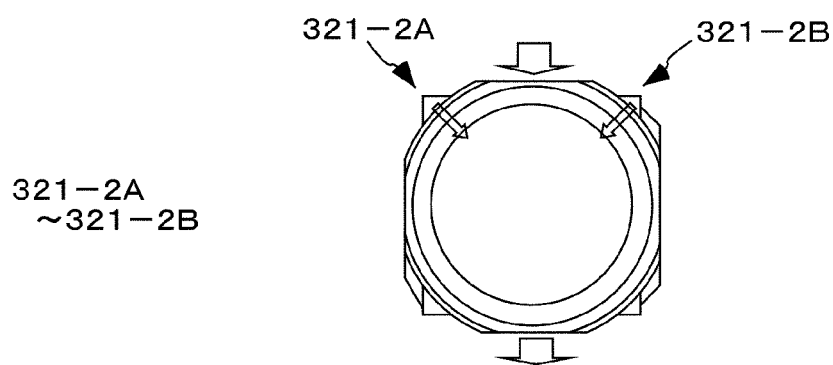
FIG. 12B is a schematic plan view for describing, as an example, the gas supply pattern when the interval between the substrates 210, 230 is large during the bonding step.
Figure 12C:
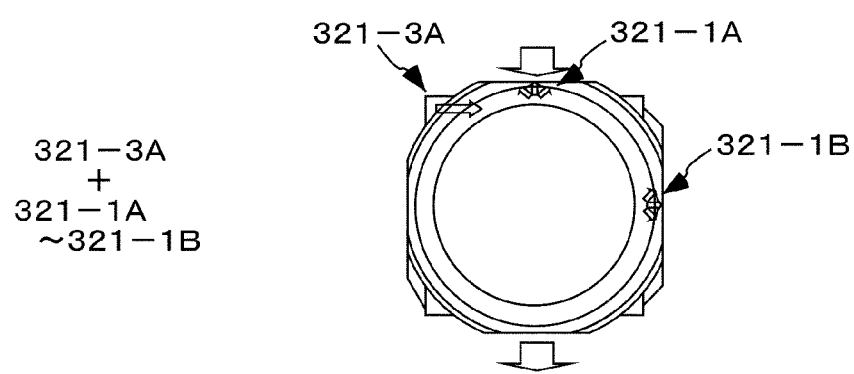
FIG. 12C is a schematic plan view for describing, as an example, the gas supply pattern when the interval between the substrates 210, 230 is large during the bonding step.
Figure 12D:
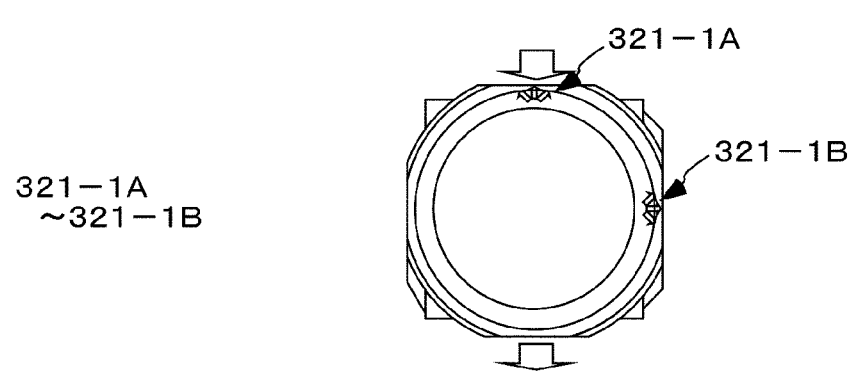
FIG. 12D is a schematic plan view for describing, as an example, the gas supply pattern when the interval between the substrates 210, 230 is large during the bonding step.

FIG. 12A to FIG. 12D show four examples of patterns in which the gas is supplied from upstream of the side flow when the configuration of the plurality of fixed pipe portions 321 according to the present embodiment is used. FIG. 12A shows a gas supply pattern using a combination of the fixed pipe portion 321-3A, and the fixed pipe portions 321-1A to 321-1D. FIG. 12B shows a gas supply pattern using only the fixed pipe portions 321-2A to 321-2B. FIG. 12C shows a gas supply pattern using a combination of the fixed pipe portion 321-3A, and the fixed pipe portions 321-1A to 321-1B. FIG. 12D shows a gas supply pattern using only the fixed pipe portions 321-1A to 321-1B.

In the present embodiment, in the four fixed pipe portions 321-1A to 321-1D arranged in four directions at intervals of 90 degrees in the XY plane, it is preferable for the control device 50 to change a direction in which the fixed pipe portion 321 is arranged to supply the gas, according to an orientation of the side flow. The four fixed pipe portions 321-3A to 321-3D are similar. It should be noted that in a state in which the interval between the two substrates 210, 230 is large, when the side flow is not flowing, it is preferable for the control device 50 to supply the gas from the appropriate fixed pipe portion 321 to create the flow in one direction between the substrates 210, 230 that are to be bonded to each other. In this case, one or more gas collection portions for collecting the gas may be formed in the upper stage 322, and the control device 50 may create the flow of the gas in one direction by collecting the gas, which is caused to flow out from the fixed pipe portion 321, by the gas collection portion.

The control device 50 according to the present embodiment is further configured to supply the gas, from the gas supply portion 350, toward surroundings of the two substrates 210, 230, in at least any case of a case where the interval described above is smaller than a predetermined size, or a case where the relative positions described above are close to each other less than a predetermined size. The surroundings of the substrates 210, 230 referred to here may be the entire peripheries of the substrates 210, 230, or may be parts of the entire peripheries of the substrates 210, 230. Thereby, the control device 50 suppresses the outflow of the gas, which exists between the two substrates 210, 230, from the space between the two substrates 210, 230. The control device 50 may supply the gas toward the entire peripheries of the substrates 210, 230 from at least any direction from above or below the substrates 210, 230, or from the sides of the substrates 210, 230.

When the substrates 210, 230 are close to each other, it is difficult for the gas from the gas supply portion 350 to flow through the center between the two substrates 210, 230 in the plane direction. Even in a case where the side flow described above is flowing, when the substrates 210, 230 are close to each other, it is difficult for the gas to flow between the substrates 210, 230. Therefore, by supplying the gas toward the surroundings of the two substrates 210, 230, the control device 50 suppress the outflow of the gas, which exists between the two substrates 210, 230, from the space between the two substrates 210, 230.

In other words, the control device 50 supplies the gas toward the surroundings of the two substrates 210, 230 such that the gas, which is already filled between the substrates 210, 230, is accumulated between the substrates 210, 230 as much as possible. In addition, by reducing the flow rate of the gas blown to the substrate 210, the substrate 230, the upper stage 322, and the lower stage 332 in comparison with a case of at least any of the case where the interval described above is large, or the case where the relative positions described above are away from each other, the control device 50 may reduce an external disturbance such as a vibration of each stage due to the gas flow.

Figure 13A:
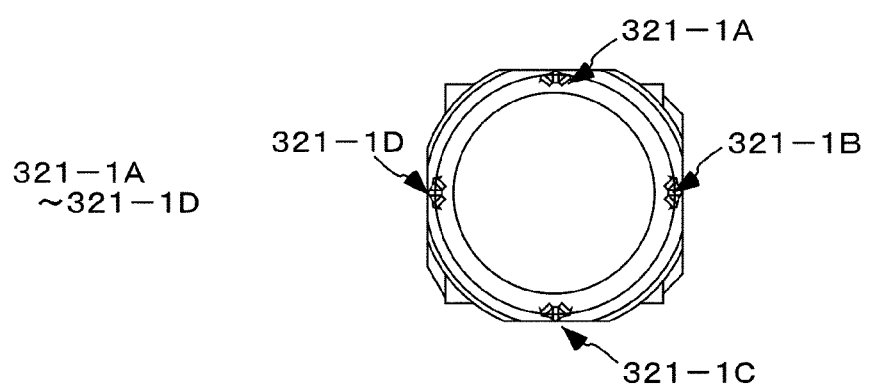
FIG. 13A is a schematic plan view for describing, as an example, the gas supply pattern when the interval between the substrates 210, 230 is small during the bonding step.
Figure 13B:
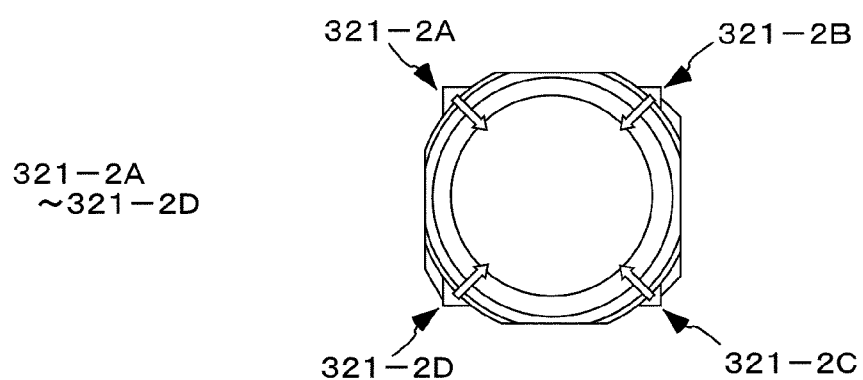
FIG. 13B is a schematic plan view for describing, as an example, the gas supply pattern when the interval between the substrates 210, 230 is small during the bonding step.

FIG. 13A and FIG. 13B show two examples of patterns in which the gas is supplied from above the substrates 210, 230 or from the sides of the substrates 210, 230 toward the entire peripheries of the substrates 210, 230 when the configuration of the plurality of fixed pipe portions 321 according to the present embodiment is used.

FIG. 13A shows a gas supply pattern using only the fixed pipe portions 321-1A to 321-1D. The bonding portion 300 may have, in addition to the fixed pipe portion 321-2A and the fixed pipe portion 321-2B, the fixed pipe portion 321-2C and the fixed pipe portion 321-2D that are respectively arranged at positions similar to those of the fixed pipe portion 321-3C and the fixed pipe portion 321-3D. FIG. 13B shows a gas supply pattern using only the fixed pipe portions 321-2A to 321-2D. It should be noted that in the present embodiment, as shown in FIG. 13A and FIG. 13B, in at least any case of the case where the interval described above is small, or the case where the relative positions described above are close to each other, the supply of the side flow toward the substrates 210, 230 may be stopped.

In the present embodiment, the case where the interval described above is large, or the case where the relative positions described above away from each other may be intended for a period to a time of starting a starting point forming operation for the substrates 210, 230, which are to be bonded to each other, to be brought into contact with each other just at only one location. The starting point forming operation referred to here may be intended to be an operation which is shown in FIG. 11, and in which the raising and lowering drive portion 338 is operated to raise the lower stage 332 and cause the substrate 210 and the substrate 230 to be close to each other. In this case, when the lower stage 332 starts to be raised, the control device 50 may perform the switch from the supply condition for forming the gas flow at least in the center between the two substrates 210, 230, to the supply condition for forming the flow that suppresses the outflow of the gas, which exists between the two substrates 210, 230, from the space between the two substrates 210, 230. Instead of this, the starting point forming operation may be intended to be an operation of releasing the holding of the central portion of the substrate 210 by the substrate holder 220 in a state in which the substrates 210, 230 are caused to be close to each other, and/or an operation of deforming the central portion of the substrate 210 into a shape protruding toward the substrate 230 by the substrate holder 220. As an example of the state in which the substrates 210, 230 are caused to be close to each other, the interval between the substrates 210, 230 may be 70 μm. In addition, instead of this, the starting point forming operation may be intended to be an operation in which the substrates 210, 230 are brought into contact with each other just at only one location. The case where the interval described above is small or the case where the relative positions described above are close to each other may be intended for a period after the starting point forming operation is started.

The bonding portion 300 of the substrate bonding device 100 may further have the interferometer to measure the interval between the substrates 210, 230 during the bonding step. The bonding portion 300 may additionally or alternatively have a load cell to detect a pressure change to the upper stage 322 or the lower stage 332. In this case, the control device 50 may acquire the measurement result from the substrate bonding device 100. It should be noted that instead of this, the control device 50 itself may perform the measurement.

It should be noted that when each of the upper stage 322 and the lower stage 332 are moved by a sequence control without measuring the interval between the substrates 210, 230 during the bonding step, it is preferable to control the gas according to the relative positions described above. It should be noted that the upper stage 322 and the lower stage 332 are examples of the two holding portions.

In at least any case of the case where the interval described above is large, or the case where the relative positions described above are away from each other, the control device 50 according to the present embodiment may further uniformly supply the gas from the upstream side of the side flow to the space between the substrates 210, 230.

In the case of controlling the gas in this way, in at least any case of the case where the interval described above is small, or the case where the relative positions described above are close to each other, the control device 50 may further supply the gas, at at least any of a relatively high supply flow rate, a relatively high supply pressure, or a relatively high temperature, to at least any location of the location where the thickness is relatively small, or the location where the amount of warp of the warp is relatively large, in the outer peripheral portions of the substrates 210, 230 that are to be bonded to each other.

In addition, in the case of controlling the gas in this way, in at least any case of the case where the interval described above is small, or the case where the relative positions described above are close to each other, the control device 50 may further supply the gas toward at least any location of the location where the thickness is relatively small, or the location where the amount of warp of the warp is relatively large, in the outer peripheral portions of the substrates 210, 230 that are to be bonded to each other.

In addition, in the case of controlling the gas in this way, in at least any case of the case where the interval described above is small, or the case where the relative positions described above are close to each other, the control device 50 may further supply the gas, at at least any of a relatively high supply flow rate, a relatively high supply pressure, or a relatively high temperature, to the location where the progression of the BW is relatively fast, in the outer peripheral sides of the substrates 210, 230 during the bonding step.

In addition, in the case of controlling the gas in this way, in at least any case of the case where the interval described above is small, or the case where the relative positions described above are close to each other, the control device 50 may further supply the gas toward the location where the progression of the BW is relatively fast, in the outer peripheral sides of the substrates 210, 230 during the bonding step.

In addition, in the case of controlling the gas in this way, in at least any case of the case where the interval described above is small, or the case where the relative positions described above are close to each other, the control device 50 may further perform setting to supply the gas, at at least any of a relatively high supply flow rate, a relatively high supply pressure, or a relatively high temperature, to the substrate holding position in the substrate bonding device 100 corresponding to at least any location of the location where a relatively large number of voids are generated, or the location where the bonding is released and the peeling occurs, in the outer peripheral portions of the substrates 210, 230 that are bonded to each other.

In addition, in the case of controlling the gas in this way, in at least any case of the case where the interval described above is small, or the case where the relative positions described above are close to each other, the control device 50 may further cause the gas to be supplied toward the substrate holding position in the substrate bonding device 100 corresponding to at least any location of the location where a relatively large number of voids are generated, or the location where the bonding is released and the peeling occurs, in the outer peripheral portions of the substrates 210, 230 that are bonded to each other.

In the above embodiment, when the gas supply portion 350 uses the helium gas and the bonding portion 300 of the substrate bonding device 100 detects the position of the lower stage 332 or the like by the interferometer, for the control device 50, a position measurement error may occur due to a fluctuation of the interferometer by mixture of the helium gas and the atmosphere between the substrates 210, 230. In order to reduce this position measurement error, it is preferable not to supply the gas to the space between the substrates 210, 230 in the alignment step of the substrates 210, 230. On the other hand, when a countermeasure against the fluctuation of the interferometer is taken, the helium gas may be supplied into the bonding portion 300 during the alignment step or before the alignment step of the substrates 210, 230. An example of such a countermeasure may be correcting the position measurement error occurring due to the interferometer fluctuation, or enclosing an optical path of light from the interferometer with a cylinder. More specifically, in a method of correcting the position measurement error, a helium concentration, a refractive index, or the like in the atmosphere on the optical path of the light from the interferometer may be measured to calculate a correction value based on the measurement result, and correct, with the correction value, a position measurement value measured by the interferometer. In another example of the countermeasure, in order for the gas, which is supplied between the substrates 210, 230, not to leak out from the space between the substrates 210, 230 to the surroundings, and at least not to flow into the optical path of the light from the interferometer, the gas leaking out may be blown by the side flow. By any of these countermeasures, the control device 50 can reduce the influence on the takt time.

In the present embodiment described above, the control device 50 has been described to perform the control to cause the substrates 210, 230, which are to be bonded to each other, to face each other, and then widen the interval between the substrates 210, 230 held by the upper stage 322 and the lower stage 332 before the atmosphere, which exists between the substrates 210, 230 that are to be bonded to each other, is replaced with the gas from the gas supply portion 350. In a case where the lower stage 332 is not moved in the Z axis direction to bond the substrates 210, 230 to each other after the substrates 210, 230, which are to be bonded to each other, are caused to face each other, the control device 50 may begin to supply the gas from the gas supply portion 350 into the bonding portion 300 before the substrates 210, 230 are caused to face each other.

More specifically, after the alignment step of the substrates 210, 230 and before the substrates 210, 230 are caused to face each other, that is, in a state in which the substrates 210, 230 are not aligned to each other in the XY plane as shown in FIG. 3, the control device 50 may operate the air cylinder portion 326 for the raising and lowering arm portion 325 and the cover portion for filling 327 to be lowered to the negative side in the Z axis direction, to a degree that the cover portion for filling 327 does not hinder the movement of the lower stage 332 holding the substrate 230. Thereby, the cover portion for filling 327 surrounds the substrate 210 from the sides over the entire periphery of the substrate 210 held by the upper stage 322. At this time, it is preferable that the space between the lower surface of the top plate 343 of the cover portion for filling 327, and the upper surface of the top plate for filling 323 is sealed with the sealing member 328.

In this state, the control device 50 may supply the gas from the gas supply portion 350 along below the bonding surface of the substrate 210 via the fixed pipe portion 321. As an example, the control device 50 may diffuse, via the fixed pipe portions 321-1A to 321-1D, the gas outwards in a radial direction along the back surface of the substrate holder 220 to fill the space between the substrate holder 220 and the cover portion for filling 327 from above.

As another example, one or more gas collection portions for collecting the gas may be formed in the upper stage 322. In this case, the control device 50 may supply the gas for the flow of the gas to be along below the bonding surface of the substrate 210 by collecting the gas, which is caused to flow out from the fixed pipe portion 321 positioned on an opposite side of the gas collection portion across the substrate 210 held by the upper stage 322, by the gas collection portion. It should be noted that in this case, it is preferable for a collection port of the gas collection portion to be positioned on the negative side further than the bonding surface of the substrate 210 in the Z axis direction, and to be positioned on the positive side in the Z axis direction to a degree that interference with the lower stage 332, which holds the substrate 230 and moves, is not caused. It should be noted that these configurations may be turned upside down when a specific gravity of the gas is heavier than that of the air.

In the above embodiment, the cover portion for filling 327 has been described to have a configuration of surrounding the substrate holder 220 holding the substrate 210 and the substrate holder 240 holding the substrate 230 in a state of being lowered to the most negative side in the Z axis direction by the air cylinder portion 326. Instead of this, the cover portion for filling 327 may surround, in this state, only the substrate 210 held on the substrate holder 220 and the substrate 230 held on the substrate holder 240, that is, may surround vicinities of the outer peripheries of the substrate 210 and the substrate 230 in a state of facing each other.

Figure 14:
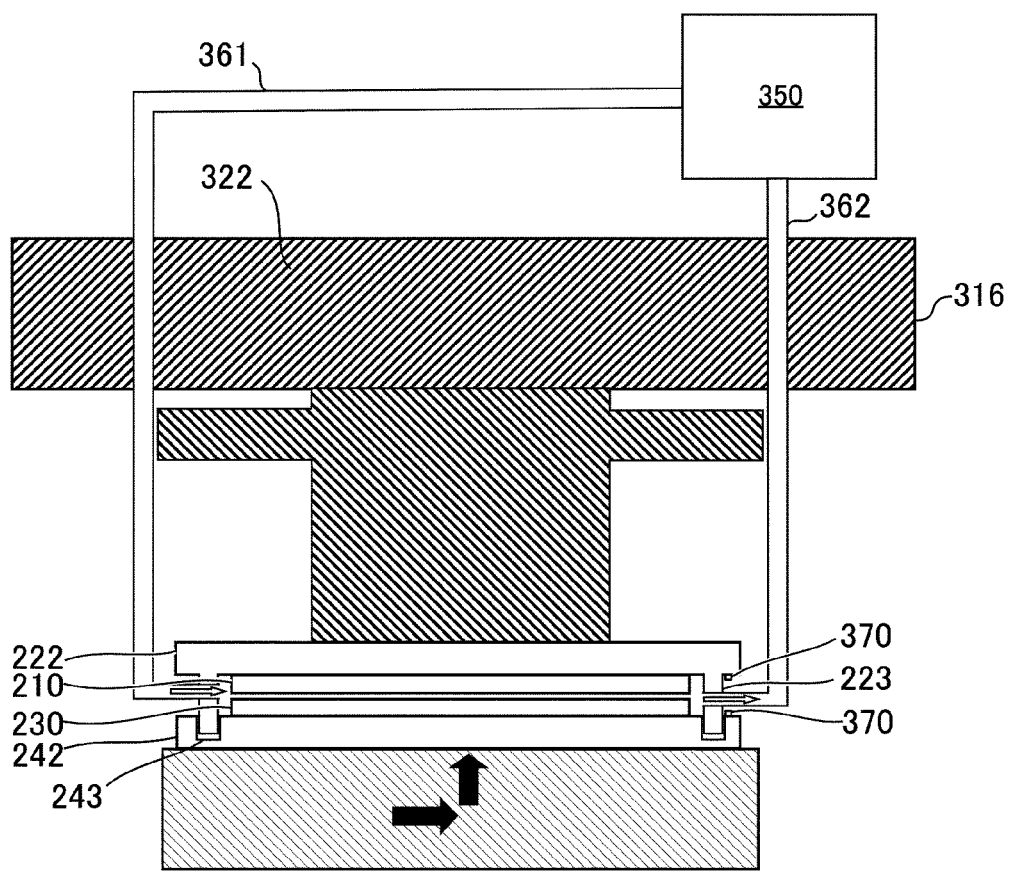
FIG. 14 is a schematic cross sectional view for describing a modification example of the gas supply method.

FIG. 14 is a schematic cross sectional view for describing a modification example of the gas supply method. The control device 50 according to the present modification example uses a substrate holder 222 having a drooping portion 223 that surrounds the substrate 210 from the sides over the entire periphery of the held substrate 210, and a substrate holder 242 having a recessed portion 243 that has a shape complementary to the drooping portion 223 to receive at least a tip portion of the drooping portion 223. It should be noted that in the present modification example, the substrate holder 222 is configured as a separate body from the upper stage 322, but may be integrally configured.

It is preferable for the tip portion of the drooping portion 223 on the negative side in the Z axis direction to be positioned on the negative side further than the bonding surface of the substrate 210 in the Z axis direction, and to be positioned on the positive side in the Z axis direction to a degree that the interference with the lower stage 332, which holds the substrate 230 and moves, is not caused. It should be noted that it can also be said that the recessed portion 243 has a function of being cleared of the drooping portion 223 when the bonding surfaces of the substrates 210, 230 are close to each other, that is, preventing the drooping portion 223 from interfering with the substrate holder 242. It should be noted that as alternative means for realizing this function, the drooping portion 223 of the substrate holder 222 may be configured to be retracted into the substrate holder 222 when the bonding surfaces of the substrates 210, 230 are close to each other. For example, a root portion of the drooping portion 223 in the Z axis direction may be configured to be held by the substrate holder 222 by an elastic body such as a spring to be retracted into the substrate holder 222 when the tip portion of the drooping portion 223 in the Z axis direction is pressed at the surface of the substrate holder 242. In addition, for example, the drooping portion 223 may be configured to be able to be moved in the Z axis direction by a motor, and may be retracted so as not to come into contact with the surface of the substrate holder 242, by the control of the control device 50, when the bonding surfaces of the substrates 210, 230 are close to each other.

The substrate holder 222 has one or more position measurement instruments 370 fixed at predetermined positions on an outer peripheral side of the drooping portion 223. In addition, similarly, the substrate holder 242 has one or more position measurement instruments 370 fixed at predetermined positions on an outer peripheral side of the recessed portion 243. That is, the drooping portion 223 is arranged between the position measurement instrument 370 and the substrate 210. The position measurement instrument 370 for each of the substrate holder 222 and the substrate holder 242 is an interferometer mirror as an example. In this case, a tip portion of the position measurement instrument 370 of the substrate holder 222 on the negative side in the Z axis direction may be positioned on the positive side in the Z axis direction further than the tip portion of the drooping portion 223 of the substrate holder 222 on the negative side in the Z axis direction. That is, a height of the drooping portion 223 from the holding surface of the substrate holder 222 may be higher than a height of the position measurement instrument 370 from the holding surface of the substrate holder 222.

It should be noted that the position measurement instrument 370 of the substrate holder 222, and the position measurement instrument 370 of the substrate holder 242 may be encoders instead of or in addition to the interferometer mirrors. It should be noted that any of the substrate holder 222 or the substrate holder 242 may not have the position measurement instrument 370.

In addition, in the present modification example, one or more gas supply pipes 361 and one or more gas collection pipes 362 are fixed, on the side of the upper stage 322, to the top plate 316 of the bonding portion 300.

In addition, in the present modification example, in each of the one or more gas supply pipes 361, one end is connected to the gas supply portion 350, and the other end is connected to a hole formed in the drooping portion 223 of the substrate holder 222 held by the upper stage 322 in the bonding portion 300, and is exposed to the side of the substrate 210 held by the substrate holder 222. Each of the one or more gas supply pipes 361 is able to send the gas supplied from the gas supply portion 350 onto the bonding surface of the substrate 210 held by the substrate holder 222 in the bonding portion 300. Each of the one or more gas supply pipes 361 in the present modification example is provided with the valve for the flow rate adjustment at the one end, and the flow rate of the gas, which is supplied into the bonding portion 300, is individually or collectively adjusted by the gas supply portion 350.

It should be noted that the other end of each of the one or more gas supply pipes 361 may be connected to a hole formed in the substrate holder 222 between the drooping portion 223 of the substrate holder 222 and the substrate 210, to be exposed to the side of the substrate 210 held by the substrate holder 222.

In addition, in the present modification example, in each of the one or more gas collection pipes 362, one end is connected to the gas supply portion 350, and the other end is connected to the hole formed in the drooping portion 223 of the substrate holder 222 held by the upper stage 322 in the bonding portion 300, and is exposed to the side of the substrate 210 held by the substrate holder 222.

Each of the one or more gas collection pipes 362 is able to collect the gas flowing on the bonding surfaces of the substrates 210, and send the gas to the gas supply portion 350. Each of the one or more gas collection pipes 362 in the present modification example is provided with the valve for the flow rate adjustment at the one end, and the flow rate of the gas, which is collected from the bonding surface of the substrate 210, is individually or collectively adjusted by the gas supply portion 350.

In the drooping portion 223, it is preferable for the other end of each of the one or more gas collection pipes 362 to be positioned on an opposite side of the other end of each of the one or more gas supply pipes 361 across the substrate 210 held by the substrate holder 222. Thereby, by collecting the gas, which is caused to flow out from the other end of each of the one or more gas supply pipes 361, at the other end of each of the one or more gas collection pipes 362, the control device 50 can effectively cause the gas to flow along below the bonding surface of the substrate 210.

As an example of the countermeasure against the fluctuation of the interferometer described above, the control device 50 according to the present modification example may use the substrate holder 222, the substrate holder 242, the one or more gas supply pipes 361, the one or more gas collection pipes 362, and the one or more position measurement instruments 370, which have configurations described above. It should be noted that these configurations may be turned upside down when a specific gravity of the gas is heavier than that of the air.

In addition, the control device 50 according to the present modification example may begin to supply the gas from the gas supply portion 350 into the bonding portion 300 before the substrates 210, 230 are caused to face each other, and form a state in which the gas flows onto the bonding surface of the substrates 210. In this case, the control device 50 causes the substrates 210, 230, which are to be bonded to each other, to face each other, and then moves the lower stage 332 in the positive direction of the z axis to bond the substrates 210, 230 to each other, as indicated by a black arrow in FIG. 14.

In this way, before the substrates 210, 230 are caused to face each other, in a case of forming a state in which the gas is accumulated on the bonding surface by the gas being caused to flow onto the bonding surface of the substrate 210, as indicated by the black arrow in FIG. 14, it is preferable for the control device 50 to set the direction, in which the gas is caused to flow from the other end of each of the one or more gas supply pipes 361 onto the bonding surface of the substrate 210, to be the same direction as the direction in which the lower stage 332 is moved in the XY plane to cause the substrates 210, 230 to face each other. This makes it possible for the control device 50 to effectively cause the gas to flow in one direction along below the bonding surface of the substrates 210. From a similar point of view, before the substrates 210, 230 are caused to face each other, in a case of forming a state in which the gas is accumulated on the bonding surface of the substrate 210, it is preferable for the control device 50 to set the direction, in which the gas is caused to flow from the other end of each of the one or more gas supply pipes 361 onto the bonding surface of the substrate 210, to be the same direction as the direction of the side flow.

In the above embodiment, on a premise that the specific gravity of the gas which is supplied from the gas supply portion 350 into the bonding portion 300 is lighter than that of the air, the configuration is set to seal, by the sealing member 328, the space between the upper surface of the top plate for filling 323, and the lower surface of the top plate 343 of the cover portion for filling 327. In a case where the specific gravity of the gas which is supplied from the gas supply portion 350 into the bonding portion 300 is heavier than that of the air, the configuration may be also set to use, instead of the top plate for filling 323, a bottom plate for filling that is positioned on the negative side further than a lower surface of the substrate holder 240 in the Z axis direction, and to seal, by the sealing member 328, a space between an upper surface of the bottom plate for filling, and a lower surface of the bottom plate 345 of the cover portion for filling 327.

In addition, when the specific gravity of the gas is lighter than that of the air, the one end of the fixed pipe portion 321 may be fixed to the substrate holder 220 such that the one end is exposed to the surface on the side holding the substrate 210 in the substrate holder 220. In addition, when the specific gravity of the gas is heavier than that of the air, the one end of the fixed pipe portion 321 may be fixed to the substrate holder 240 such that the one end is exposed to the surface on the side holding the substrate 230 in the substrate holder 240. In any case, by the one end of the fixed pipe portion 321 being connected to the outward outer peripheral portions of the substrate 210 and the substrate 230 in the substrate holder 220 and the substrate holder 240, the gas may be discharged toward the outer peripheries of the substrate 210 and the substrate 230.

In addition, the bonding portion 300 may be configured to be able to supply the gas which is from the gas supply portion 350, in both directions from above and below an upper stage 322 side and a lower stage 332 side. As an example, the control device 50 may supply the gas toward the space between the substrates 210, 230 that are to be bonded to each other, from below the substrate 210 or the like, both from above and below the substrate 210 or the like, both from above the substrate 210 or the like and from the side of the substrate 210 or the like, both from below the substrate 210 or the like and from the side of the substrate 210 or the like, or all from above and below the substrate 210 or the like, and from the side of the substrate 210 or the like. When the gas is supplied from multiple directions in this way, for example, the control device 50 may be able to shorten the time for filling the space between the substrates 210, 230 with the gas.

In the above embodiment, the cover portion for filling 327 may be heated by a heater. Thereby, it is possible to raise, by the heat of the cover portion for filling 327, not only the temperature of the gas supplied from the gas supply portion 350 into the bonding portion 300, but also the temperature of the side flow flowing toward the substrates 210, 230 that are to be bonded to each other, and it is possible to suppress the generation of the adiabatic expansion void.

In the above embodiment, it is preferable for the substrate bonding device 100 to hold, on the upper stage 322 side, the substrate having a relatively centrally protruding shape on the bonding surface side, in a cross section perpendicular to the bonding surface, in the substrates 210, 230 that are to be bonded to each other, and to release the held substrate toward the other substrate held on the lower stage 332 side. This makes it possible to preferably widen the space between the substrates during the progression of the BW.

In the above embodiment, the bonding portion 300 or the control device 50 may have a humidity monitor that is able to measure a humidity in at least a space inside the cover portion for filling 327. According to a measurement result by the humidity monitor, for example, according to the humidity in the space falling below a predetermined threshold value, the control device 50 may determine that the atmosphere between the substrates 210, 230, which are to be bonded to each other, has been replaced with the gas from the gas supply portion 350. Additionally or alternatively, the bonding portion 300 or the control device 50 may have a monitor that is able to measure a temperature, an atmospheric pressure, or the like in at least a space inside the cover portion for filling 327. In this case, according to a measurement result by the monitor, for example, according to the temperature or the atmospheric pressure in the space exceeds a predetermined threshold value, the control device 50 may determine that the atmosphere between the substrates 210, 230, which are to be bonded to each other, has been replaced with the gas from the gas supply portion 350, or determine that a situation, in which it is difficult for the adiabatic expansion void to be generated, has occurred.

In the above embodiment, the control device 50 may use a test substrate in which a plurality of humidity sensors are distributed and built in the bonding surface, check an appropriate humidity balance and a gas filling time between the substrates that are to be bonded to each other, and set a check result of the test substrate as a guide to control the gas, in the same manner, at a time of bonding the substrates 210, 230 that are used as a product.

In the above embodiment, the control device 50 may control the gas which is supplied from the gas supply portion 350 into the bonding portion 300, only in any case of the case where the interval between the substrates 210, 230 during the bonding step is large, or the case where the relative positions of the upper stage 322 and the lower stage 332, which hold the substrates 210, 230 during the bonding step, are away from each other in the bonding direction.

In the above embodiment, when the substrate is determined to be below a predetermined criterion based on the measurement result obtained before the substrate bonding step, the control device 50 may determine the substrate to be excluded from the bonding target.

In the above embodiment, the control device 50 has been described to have a configuration separate from the substrate bonding device 100. Instead of this, the control device 50 may be integrated into the substrate bonding device 100, in other words, the substrate bonding device 100 may include the control device 50, and in addition, the substrate bonding device 100 may include a control portion that executes some function of the control device 50, in which case, the control device 50 may execute or may not execute the function.

In the above embodiment, the mode, in which the substrate 210 held on the upper stage 322 side is released toward the substrate 230 held on the lower stage 332 side, has been mainly described, and vice versa, that is, the substrate 230 held on the lower stage 332 side may be released toward the substrate 210 held on the upper stage 322 side. In addition, the substrate holders 220, 240 may be supplied with negative pressures from the upper stage 322 and the lower stage 332, respectively, or may include pumps that supply the negative pressures themselves.

Various embodiments of the present invention may be described with reference to flowcharts and block diagrams whose blocks may represent (1) steps of processes in which operations are performed or (2) sections of devices responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing device, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

Figure 15:
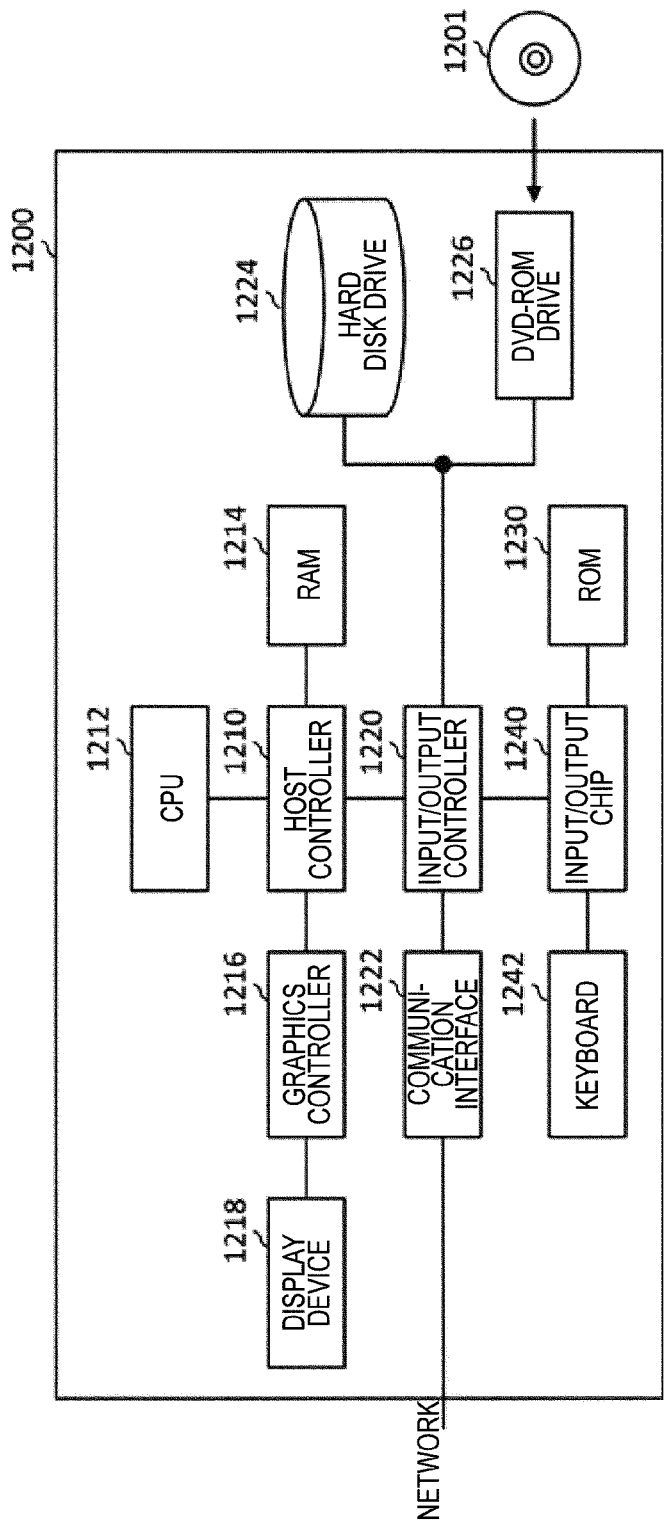
FIG. 15 shows an example of a computer 1200 in which a plurality of aspects of the present invention may be embodied entirely or partially.

FIG. 15 shows an example of the computer 1200 which can realize a plurality of aspects of the present invention entirely or partially. A program installed on the computer 1200 can cause the computer 1200 to function as an operation associated with a device according to embodiments of the present invention or as one or more "unit(s)" of the device, or to perform the operation or the one or more "unit(s)", and/or can cause the computer 1200 to perform processes according to embodiments of the present invention or steps of the processes. Such a program may be executed by a CPU 1212 to cause the computer 1200 to perform particular operations associated with some or all blocks in the flowcharts or block diagrams described herein.

The computer 1200 according to the present embodiment includes a CPU 1212, a RAM 1214, a graphics controller 1216 and a display device 1218, which are connected to each other by a host controller 1210. The computer 1200 also includes input/output units such as a communication interface 1222, a hard disk drive 1224, a DVD-ROM drive 1226 and an IC card drive, which are connected to the host controller 1210 via an input/output controller 1220. The computer also includes legacy input/output units such as a ROM 1230 and a keyboard 1242, which are connected to the input/output controller 1220 via an input/output chip 1240.

The CPU 1212 operates in accordance with programs stored in the ROM 1230 and the RAM 1214, and controls each unit accordingly. The graphics controller 1216 acquires image data generated by the CPU 1212 on a frame buffer or the like provided in the RAM 1214 or in the graphics controller 1216 itself, and displays the image data on the display device 1218.

The communication interface 1222 communicates with other electronic devices via a network. The hard disk drive 1224 stores programs and data to be used by the CPU 1212 in the computer 1200. The DVD-ROM drive 1226 reads programs or data from the DVD-ROM 1201, and provides the programs or data to the hard disk drive 1224 via the RAM 1214. The IC card drive reads programs and data from an IC card and/or writes programs and data into the IC card.

The ROM 1230 has stored therein a boot program or the like to be executed by the computer 1200 at the time of activation, and/or a program that depends on the hardware of the computer 1200. The input/output chip 1240 may also connect various input/output units to the input/output controller 1220 via a parallel port, a serial port, a keyboard port, a mouse port or the like.

Programs are provided by a computer-readable storage medium such as the DVD-ROM 1201 or an IC card. The programs are read from the computer-readable storage medium, installed on the hard disk drive 1224, the RAM 1214 or the ROM 1230, which are also examples of a computer-readable storage medium, and executed by the CPU 1212. The information processing described in the programs is read into the computer 1200, resulting in cooperation between the programs and the above various types of hardware resources. A device or method may be constituted by implementing the operation or processing of information in accordance with the use of the computer 1200.

For example, if a communication is performed between the computer 1200 and external devices, the CPU 1212 may execute a communication program loaded on the RAM 1214, and instruct the communication interface 1222 to perform communication process based on the process described in the communication program. Under the control of the CPU 1212, the communication interface 1222 reads transmission data stored in a transmission buffer region provided in a recording medium such as the RAM 1214, the hard disk drive 1224, the DVD-ROM 1201 or an IC card, and sends the read transmission data to the network, or writes reception data received from the network into a reception buffer region or the like provided in the recording medium.

The CPU 1212 may also make all or required portions of the files or databases stored in an external recording medium such as the hard disk drive 1224, the DVD-ROM drive 1226 (DVD-ROM 1201) or an IC card to be read by the RAM 1214, and perform various types of processing on the data on the RAM 1214. Then, the CPU 1212 may write back the processed data to the external recording medium.

Various types of information such as various types of programs, data, tables and databases may be stored in the recording medium for information processing. The CPU 1212 may perform various types of processing on the data read from the RAM 1214, which includes various types of operations, information processing, condition judging, conditional branch, unconditional branch, search/replacement of information, etc., as described throughout this disclosure and specified by an instruction sequence of programs, and writes the result back to the RAM 1214. In addition, the CPU 1212 may search for information in a file, a database, etc., in the recording medium. For example, when a plurality of entries, each having an attribute value of a first attribute associated with an attribute value of a second attribute, are stored in the recording medium, the CPU 1212 may search the plurality of entries for an entry whose attribute value of the first attribute matches a designated condition, read the attribute value of the second attribute stored in the entry, and thereby acquire the attribute value of the second attribute associated with the first attribute that meets a predetermined condition.

The programs or software modules in the above description may be stored on the computer 1200 or a computer-readable storage medium near the computer 1200. Further, a recording medium such as a hard disk or a RAM provided in a server system connected to a dedicated communication network or the Internet can be used as a computer-readable storage media, which provides programs to the computer 1200 via the network.

While the embodiments of the present invention have been described, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the present invention.

Note that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As is clear from the above description, with (one) embodiment of the present invention it is possible to realize a control device and a control method for controlling a supply condition of a gas, which is supplied between two substrates that are to be bonded to each other by a substrate bonding device, and a computer-readable medium having recorded thereon a program that causes the control method to be executed.

EXPLANATION OF REFERENCES

10: substrate bonding unit, 20: circle of a dashed line, 50: control device, 100: substrate bonding device, 110: housing, 120, 130: substrate cassette, 140: transportation portion, 170: activation device, 201: layered substrate, 210, 230: substrate, 220, 222, 240, 242: substrate holder, 223: drooping portion, 241: wall portion, 243: recessed portion, 300: bonding portion, 310: frame body, 312: bottom plate, 316: top plate, 321, 321-1A, 321-1B, 321-1C, 321-1D, 321-2A, 321-2B, 321-3A, 321-3B, 321-3C, 321-3D: fixed pipe portion, 322: upper stage, 323: top plate for filling, 324, 334: microscope, 325: raising and lowering arm portion, 326: air cylinder portion, 327: cover portion for filling, 328: sealing member, 331: X direction drive portion, 332: lower stage, 333: Y direction drive portion, 338: raising and lowering drive portion, 341: side wall, 343: top plate, 345: bottom plate, 350: gas supply portion, 361: gas supply pipe, 362: gas collection pipe, 370: position measurement instrument, 400: holder stocker, 500: pre-aligner, 1200: computer, 1201: DVD-ROM, 1210: host controller, 1212: CPU, 1214: RAM, 1216: graphics controller, 1218: display device, 1220: input/output controller, 1222: communication interface, 1224: hard disk drive, 1226: DVD-ROM drive, 1230: ROM, 1240: input/output chip, 1242: keyboard

What is claimed is:

1. A control device configured to control a supply condition of a gas which is supplied toward a space between two substrates that are to be bonded to each other by a substrate bonding device,
   the two substrates being bonded to each other by expanding a contact region formed in a center portion of the two substrates, and
   the control device being configured to control the supply condition based on a measurement result obtained by a measurement in relation to at least one of an aspect of a thickness of an outer peripheral portion of each of the two substrates, an aspect of a warp in the outer peripheral portion of each of the two substrates, an aspect of a bonding wave that is generated between the two substrates during a step of bonding the two substrates, an aspect of a void generated in an outer peripheral portion of two bonded substrates different from the two substrates, or an aspect of bonding between two bonded substrates different from the two substrates.

2. The control device according to claim 1, wherein the supply condition is at least any of a supply flow rate of the gas to the space between the two substrates, a supply pressure of the gas, a supply time of the gas, a supply direction of the gas, a humidity of the gas, a temperature of the gas, or a discharge flow rate from the space between the two substrates of the gas.

3. The control device according to claim 1, the control device being configured to supply the gas, at at least any of a relatively high supply flow rate, a relatively high supply pressure, or a relatively high temperature, to at least any location of a location where the thickness is relatively small, or a location where an amount of warp of the warp is relatively large, in the outer peripheral portion of the two substrates.

4. The control device according to claim 1, the control device being configured to supply the gas toward at least any location of a location where the thickness is relatively small, or a location where an amount of warp of the warp is relatively large, in the outer peripheral portion of the two substrates.

5. The control device according to claim 1, the control device being configured to supply the gas, at at least any of a relatively high supply flow rate, a relatively high supply pressure, or a relatively high temperature, to a location where a progression of the bonding wave is relatively fast, in an outer peripheral side of the two substrates during the step of bonding the two substrates.

6. The control device according to claim 1, the control device being configured to supply the gas toward a location where a progression of the bonding wave is relatively fast, in an outer peripheral side of the two substrates during the step of bonding the two substrates.

7. The control device according to claim 1, the control device being configured to cause the gas to be supplied, at at least any of a relatively high supply flow rate, a relatively high supply pressure, or a relatively high temperature, to a substrate holding position in the substrate bonding device corresponding to at least any location of a location where a relatively large number of voids are generated, or a location where the bonding is released and peeling occurs, in the outer peripheral portion of the two bonded substrates.

8. The control device according to claim 1, the control device being configured to cause the gas to be supplied, toward a substrate holding position in the substrate bonding device corresponding to at least any location of a location where a relatively large number of voids are generated, or a location where the bonding is released and peeling occurs, in the outer peripheral portion of the two bonded substrates.

9. The control device according to claim 1, the control device being configured to supply the gas to the space between the two substrates before a contact between the two substrates.

10. A substrate bonding device comprising the control device according to claim 1.

11. A control device configured to control a supply condition of a gas which is supplied between two substrates that are to be bonded to each other by a substrate bonding device,
the two substrates being bonded to each other by expanding a contact region formed in a center portion of the two substrates, and the control device being configured to control the supply condition based on a measurement result obtained by a measurement in relation to at least one of the two substrates, two other substrates bonded before the two substrates are bonded, or the substrate bonding device,
the measurement result includes at least any of an interval between the two substrates during a bonding step, or relative positions of two holding portions holding the two substrates during the bonding step,
the control device being configured to:
supply the gas at least to a center between the two substrates in a plane direction, in at least any case of a case where the interval is larger than or equal to a predetermined size, or a case where the relative positions are away from each other by the predetermined size or more; and
supply the gas to surroundings of the two substrates, in at least any case of a case where the interval is smaller than the predetermined size, or a case where the relative positions are close to each other less than the predetermined size.

12. The control device according to claim 11, the control device being configured to supply the gas from an upstream side of flowing of air which flows in one direction from sides of the two substrates toward the two substrates, in at least any case of the case where the interval is larger than or equal to the predetermined size, or the case where the relative positions are away from each other by the predetermined size or more.

13. The control device according to claim 11, the control device being configured to supply the gas toward entire peripheries of the two substrates from at least any direction from above the two substrates, a direction from below the two substrates, or a direction from sides of the two substrates, in at least any case of the case where the interval is smaller than the predetermined size, or the case where the relative positions are close to each other less than the predetermined size.

14. A control device configured to control a supply condition of a gas which is supplied between two substrates that are to be bonded to each other by a substrate bonding device,
the two substrates being bonded to each other by expanding a contact region formed in a center portion of the two substrates, and the control device being configured to control the supply condition based on a measurement result obtained by a measurement in relation to at least one of the two substrates, two other substrates bonded before the two substrates are bonded, or the substrate bonding device,
the control device being further configured to control two holding portions holding the two substrates that are to be bonded to each other, cause the two substrates, which are to be bonded to each other, to face each other, and then widen an interval between the two substrates held by the two holding portions before an atmosphere, which exists between the two substrates that are to be bonded to each other, is replaced with the gas.

15. A control device configured to control a supply condition of a gas which is supplied between two substrates that are to be bonded to each other by a substrate bonding device, the two substrates being bonded to each other by expanding a contact region formed in a center portion of the two substrates, and the control device being configured to switch the supply condition in response to a change of an interval between the two substrates.

16. The control device according to claim 15, the control device being configured to supply the gas to a space between the two substrates before a contact between the two substrates.

17. A control method for controlling a supply condition of a gas which is supplied toward a space between two substrates that are to be bonded to each other by a substrate bonding device, the two substrates being bonded to each other by expanding a contact region formed in a center portion of the two substrates, and the control method comprising: controlling the supply condition based on a measurement result obtained by a measurement in relation to at least one of an aspect of a thickness of an outer peripheral portion of each of the two substrates, an aspect of a warp in the outer peripheral portion of each of the two substrates, an aspect of a bonding wave that is generated between the two substrates during a bonding step, an aspect of a void generated in an outer peripheral portion of two other substrates bonded before the two substrates are bonded, or an aspect of bonding between the two other substrates.

18. A computer-readable medium having recorded thereon a program that, when executed by a computer, causes the computer to perform the control method according to claim 17.

* * * * *